US012777950B2

(12) United States Patent
Chen et al.

(10) Patent No.: US 12,777,950 B2
(45) Date of Patent: Oct. 27, 2026

(54) ELECTRONIC PACKAGE

(71) Applicant: Advanced Semiconductor Engineering, Inc., Kaohsiung (TW)

(72) Inventors: Pin-Yao Chen, Kaohsiung (TW); Shiuan-Yu Lin, Kaohsiung (TW); Hung-Jung Tu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 562 days.

(21) Appl. No.: 18/144,162

(22) Filed: May 5, 2023

(65) Prior Publication Data

US 2024/0371739 A1 Nov. 7, 2024

(51) Int. Cl.

*H10W 70/65* (2026.01)
*H10W 70/05* (2026.01)
*H10W 70/685* (2026.01)
*H10W 72/20* (2026.01)
*H10W 74/15* (2026.01)
*H10W 90/00* (2026.01)

(52) U.S. Cl.

CPC ........... *H10W 70/65* (2026.01); *H10W 70/05* (2026.01); *H10W 70/095* (2026.01); *H10W 70/685* (2026.01); *H10W 72/221* (2026.01); *H10W 72/223* (2026.01); *H10W 72/232* (2026.01); *H10W 72/234* (2026.01); *H10W 72/235* (2026.01); *H10W 72/252* (2026.01); *H10W 72/255* (2026.01); *H10W 72/281* (2026.01); *H10W 74/15* (2026.01); *H10W 90/401* (2026.01); *H10W 90/701* (2026.01); *H10W 90/724* (2026.01); *H10W 90/734* (2026.01)

(58) Field of Classification Search

CPC ........... H01L 23/49838; H01L 21/4857; H01L 23/49822; H01L 21/486; H10W 70/65; H10W 70/685; H10W 70/095; H10W 70/05

See application file for complete search history.

(56) References Cited

U.S. PATENT DOCUMENTS

| | | | | |
|---|---|---|---|---|
| 7,383,630 | B2 * | 6/2008 | Shen | H10W 70/635 29/846 |
| 9,252,065 | B2 * | 2/2016 | Lin | H10W 90/00 |
| 2001/0040290 | A1 * | 11/2001 | Sakurai | H01L 24/13 257/737 |
| 2011/0147917 | A1 * | 6/2011 | England | H10W 70/635 257/E23.141 |
| 2022/0223536 | A1 * | 7/2022 | Wang | H01L 21/76831 |

FOREIGN PATENT DOCUMENTS

| | | |
|---|---|---|
| CN | 113784537 A | 12/2021 |

* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

An electronic package includes a pad, a dielectric layer, a bump, and a conductive element. The dielectric layer encapsulates the pad and includes an opening exposing the pad. The bump is disposed over the pad. The conductive element is disposed in the opening between the pad and the bump. The conductive element is configured to mitigate a shrinkage of an electrical path between the pad and the bump occupied by an expansion of the dielectric layer.

18 Claims, 37 Drawing Sheets

ELECTRONIC PACKAGE

BACKGROUND

1. Field of the Disclosure

The present disclosure relates to an electronic package, and to an electronic package including a pad and a bump.

2. Description of the Related Art

With rapid developments in semiconductor processing technologies, semiconductor chips are integrating with an increasing number of electronic components to improve performance and include more function. A conductive post or bump in an electronic package may be fractured or broken during manufacture due to expansion of the dielectric layer. For example, if the size of the opening of the dielectric layer for the conductive post or bump is reduced, the profile of the opening would be abnormal and a portion of the opening may be filled, thus, the conductive post or bump may not be formed in the opening completely. To prevent such difficulties, an improved electronic package is thus needed.

SUMMARY

In some embodiments, an electronic package includes a pad, a dielectric layer, a bump, and a conductive element. The dielectric layer encapsulates the pad and includes an opening exposing the pad. The bump is disposed over the pad. The conductive element is disposed in the opening between the pad and the bump. The conductive element is configured to mitigate a shrinkage of an electrical path between the pad and the bump occupied by an expansion of the dielectric layer.

In some embodiments, an electronic package includes a pad, a dielectric layer, a bump, and a conductive element. The dielectric layer encapsulates the pad and includes an opening exposing the pad. The bump is disposed over the pad. The conductive element is disposed in the opening between the pad and the bump. The conductive element is configured to elongate an electrical path from the pad.

In some embodiments, an electronic package includes a pad, a first dielectric layer, a bump, and a conductive element. The first dielectric layer encapsulates the pad and includes an opening exposing the pad. The bump is disposed over the pad. The conductive element is disposed in the opening and inserting into the bump. The conductive element is configured to inhibit a tilt of the bump and enhance a reliability of a connection between the bump and the conductive element.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
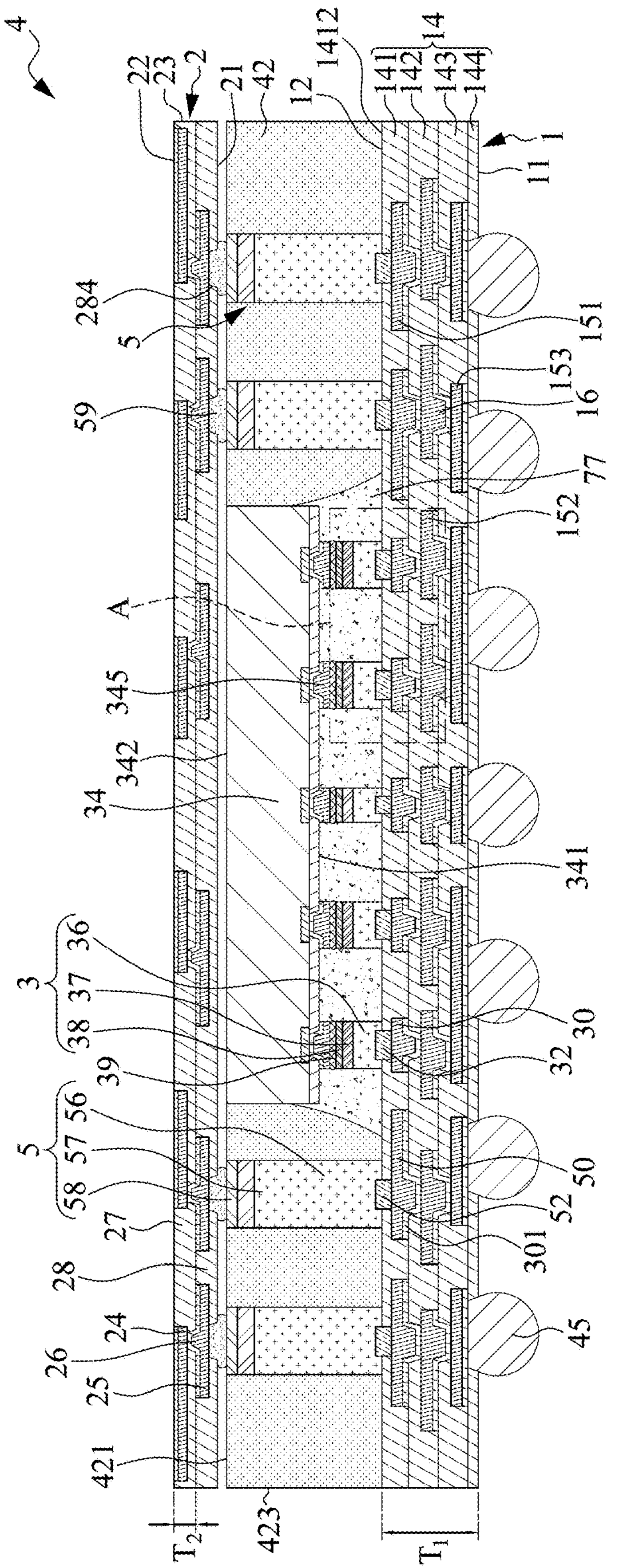
FIG. 1 illustrates a cross-sectional view of an electronic package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an electronic package 4 according to some embodiments of the present disclosure. The electronic package 4 may include a first circuit pattern structure 1, a second circuit pattern structure 2, an electronic device 34, an underfill 77, at least one vertical conductive structure 5, an encapsulant 42, and at least one external connector 45.

The first circuit pattern structure 1 may be a redistribution structure or an embedded trace substrate (ETS), and may have a first surface 11 (e.g., a bottom surface), a second surface 12 (e.g., a top surface) opposite to the first surface 11. The first circuit pattern structure 1 may include a dielectric structure 14, a plurality of circuit layers 151, 152, 153, a plurality of inner vias 16, a plurality of conductive elements 32, 52, and a plurality of bumps 3. The dielectric structure 14 may include a plurality of dielectric layers (including, for example, a first dielectric layer 141, a second dielectric layer 142, a third dielectric layer 143 and a fourth dielectric layer 144) stacked on one another. The first dielectric layer 141, the second dielectric layer 142, the third dielectric layer 143 and the fourth dielectric layer 144 may be made of a cured photoimageable dielectric (PID) material such as epoxy or polyimide (PI) including photoinitiators. In some embodiments, the fourth dielectric layer 144 and the first dielectric layer 141 may include solder mask.

The first dielectric layer 141 may be the topmost dielectric layer, and the fourth dielectric layer 144 may be the bottommost dielectric layer. The inner vias 16 may taper downward. The second dielectric layer 142 is disposed under the first dielectric layer 141.

The circuit layers 151, 152, 153 may include a first circuit layer 151, a second circuit layer 152 and a third circuit layer 153, and may be embedded in the dielectric structure 14. Each of the circuit layers 151, 152, 153 may be a redistribution layer (RDL) or a conductive layer. In some embodiments, each of the circuit layers 151, 152, 153 may include a metallic layer (e.g. copper) disposed on a seed layer (e.g., titanium copper) such as the seed layer 301. In some embodiments, each of the circuit layers 151, 152, 153 may include at least one trace and at least one pad. For example, the first circuit layer 151 may include a plurality of pads 30, 50. The inner vias 16 may electrically connect at least one of the circuit layers 151, 152, 153 or two adjacent circuit layers 151, 152, 153. In some embodiments, the inner vias 16 may taper upward. The conductive elements 32, 52 may be disposed on the pads 30, 50 of the first circuit layer 151. In some embodiments, a width of the conductive elements 32, 52 may be less than 5 μm or less than 4 μm. The bumps 3 may be electrically connected to the first circuit layer 151 through the conductive elements 32. The vertical conductive structure 5 may be electrically connected to the first circuit layer 151 through the conductive elements 52.

The conductive element 32 reduces a shrinkage of a cross section of an electrical path between the pad 30 and the bump 3. The conductive element 52 reduces a shrinkage of a cross section of an electrical path between the pad 50 and the bump 5. The conductive element 32 reduces a necking of an electrical path between the pad 30 and the bump 3. The conductive element 52 reduces a necking of an electrical path between the pad 50 and the bump 5. The conductive element 32 and 52 prevent (or reduce, or improve) a hole wrapping phenomenon of the dielectric layer 141. The conductive element 32 is configured to be interposed between the bump 3 and the pad 30. The conductive element 52 is configured to be interposed between the bump 5 and the pad 50. The conductive element 32 is configured to be sandwiched between the bump 3 and the pad 30. The conductive element 52 is configured to be sandwiched between the bump 5 and the pad 50. The conductive element 32 is configured to mitigate a shrinkage of an electrical path between the pad 30 and the bump 3 occupied by an expansion of the dielectric layer 141. The conductive element 52 is configured to mitigate a shrinkage of an electrical path between the pad 50 and the bump 5 occupied by an expansion of the dielectric layer 141. The conductive element 32 is configured to elongate an electrical path from the pad 30. The conductive element 52 is configured to elongate an electrical path from the pad 50.

The first circuit pattern structure 1 may be also referred to as "a stacked structure" or "a high-density electronic structure", "a high-density redistribution structure" or "a high-density stacked structure." In addition, the first circuit pattern structure 1 may be also referred to as "a second circuit pattern structure." Each of the circuit layers (including the first circuit layer 151, the second circuit layer 152 and the third circuit layer 153) of the first circuit pattern structure 1 may be also referred to as "a high-density redistribution layer" or "a high-density circuit layer." The first circuit pattern structure 1 has a thickness $T_1$.

The electronic device 34 may be a semiconductor element or a semiconductor die such as an application specific integrated circuit (ASIC) die, and may be disposed over and electrically connected to the second surface 12 (e.g., top surface) of the first circuit pattern structure 1. Thus, the electronic device 34 may be disposed adjacent to or disposed over the second surface 12 (e.g., top surface) of the first circuit pattern structure 1. The electronic device 34 may be disposed between the first circuit pattern structure 1 and the second circuit pattern structure 2. The electronic device 34 has a lower surface 341 (e.g., active surface) and an upper surface 342 (e.g., back side surface) opposite to the lower surface 341 (e.g., active surface), and may include a plurality of conductive pads 345 disposed adjacent to the lower surface 341. A material of the conductive pad 345 may be, for example, aluminum (Al), tin (Sn), lead (Pb) or other suitable metals or alloy. In the present embodiment, the material of the conductive pad 345 is aluminum (Al). In some embodiments, the conductive pads 345 of the electronic device 34 may be bonded to the bumps 3 of the first circuit pattern structure 1 through a bonding material 39 such as soldering material.

The underfill 77 may be disposed in the space between the lower surface 341 (e.g., active surface) of the electronic device 34 and the second surface 12 (e.g., top surface) of the first circuit pattern structure 1 so as to cover and protect the bonding material 39, the bumps 3 and the conductive pads 345 of the electronic device 34.

The second circuit pattern structure 2 may be disposed over the top surface 421 of the encapsulant 42. Thus, the second circuit pattern structure 2 may be located over the second surface 12 (e.g., top surface) of the first circuit pattern structure 1 and the electronic device 34. In some embodiments, the second circuit pattern structure 2 may be physically connected and electrically connected to the second surface 12 (e.g., top surface) of the first circuit pattern structure 1 through the vertical conductive structure(s) 5.

The second circuit pattern structure 2 may be a redistribution structure, and may have a first surface 21 (e.g., a bottom surface), a second surface 22 (e.g., a top surface) opposite to the first surface 21, and a lateral surface 23 extending between the first surface 21 and the second surface 22. The second circuit pattern structure 2 may include a first circuit layer 24 (e.g., a topmost circuit layer), a first dielectric layer 27 (e.g., a top dielectric layer), a second circuit layer 25 (e.g., a bottommost circuit layer), a second dielectric layer 28 (e.g., a bottom dielectric layer) and at least one inner via 26. The first dielectric layer 27 (e.g., top dielectric layer) may be disposed on a top surface of the second dielectric layer 28 (e.g., a bottom dielectric layer). Alternatively, the second dielectric layer 28 may be disposed on the first dielectric layer 27. The first dielectric layer 27 and the second dielectric layer 28 may be made of a cured photoimageable dielectric (PID) material such as epoxy or polyimide (PI) including photoinitiators. In some embodiments, the second dielectric layer 28 may include solder mask. The second dielectric layer 28 may include substrate structure or core substrate, etc.

The first circuit layer 24 (e.g., a topmost circuit layer) and the second circuit layer 25 (e.g., a bottommost circuit layer) may be embedded in the first dielectric layer 27 and the second dielectric layer 28. Each of the circuit layers 24, 25 may be a redistribution layer (RDL). In some embodiments, each of the first circuit layer 24 and the second circuit layer 25 may include a metallic layer (e.g. copper) disposed on a seed layer (e.g., titanium copper). In some embodiments, each of the first circuit layer 24 and the second circuit layer 25 may include at least one trace and at least one pad. The inner via 26 may be a monolithic inner via, and may physically connect and electrically connect the first circuit layer 24 (e.g., a topmost circuit layer) and the second circuit layer 25 (e.g., a bottommost circuit layer). In some embodiments, the second circuit pattern structure 2 may include a plurality of inner vias 26. The inner vias 26 may taper upward. That is, a width of each of the inner vias 26 may gradually decrease toward the first dielectric layer 27. In addition, the second dielectric layer 28 (e.g., bottom dielectric layer) may define a plurality of openings 284 extending through the second dielectric layer 28 to expose portions of the bottommost circuit layer (e.g., the second circuit layer 25). A bonding material 59 such as soldering material may be disposed in the opening 284 to connect the vertical conductive structure 5 and the bottommost circuit layer (e.g., the second circuit layer 25) of the second circuit pattern structure 2.

The second circuit pattern structure 2 may be also referred to as “a stacked structure” or “a low-density electronic structure”, “a low-density redistribution structure” or “a low-density stacked structure.” In addition, the second circuit pattern structure 2 may be also referred to as “a first circuit pattern structure.” Each of the first circuit layer 24 and the second circuit layer 25 of the second circuit pattern structure 2 may be also referred to as “a low-density redistribution layer” or “a low-density circuit layer.” In some embodiments, a density of a circuit line (including, for example, a trace or a pad) of the low-density circuit layer (e.g., the first circuit layer 24 and the second circuit layer 25 of the second circuit pattern structure 2) is less than a density of a circuit line of a low-density circuit layer (e.g., the circuit layers 151, 152, 153 of the first circuit pattern structure 1). That is, the count of the circuit line (including, for example, a trace or a pad) in a unit area of the low-density circuit layer is less than the count of the circuit line in an equal unit area of the high-density circuit layer, such as about 90% or less, about 50% or less, or about 20% or less. Alternatively, or in combination, a line space/line width (L/S) of the low-density circuit layer is greater than an L/S of the high-density circuit layer, such as about 1.2 times or greater, about 1.5 times or greater, or about 2 times or greater. The second circuit pattern structure 2 has a thickness $T_2$. The thickness $T_1$ of the first circuit pattern structure 1 may be greater than the thickness $T_2$ of the second circuit pattern structure 2.

The vertical conductive structure 5 may be disposed around the electronic device 34, and may be a pillar structure. The vertical conductive structure 5 may include a homogeneous metal material such as copper. Alternatively, the vertical conductive structure 5 may be a three-layered structure, and may include a first layer 56 (e.g., a copper layer), a second layer 57 (e.g., a nickel layer) and a third layer 58 (e.g., a gold layer).

The encapsulant 42 may be disposed in the space between the first circuit pattern structure 1 and the second circuit pattern structure 2 so as to encapsulate the electronic device 34, the vertical conductive structure(s) 5, the bonding material 59 and the underfill 37. A material of the encapsulant 42 may be a molding compound with or without fillers. The encapsulant 42 has a top surface 421 and a lateral surface 423 that is coplanar with or aligned with the lateral surface 23 of the second circuit pattern structure 2 and a lateral surface of the first circuit pattern structure 1. As shown in FIG. 1, the top surface 421 of the encapsulant 42 may be coplanar with or aligned with the upper surface 342 (e.g., back side surface) of the electronic device 34 and the top surface of the vertical conductive structure(s) 5. However, in some embodiments, the encapsulant 42 may cover the upper surface 342 (e.g., back side surface) of the electronic device 34.

The external connector 45 may be disposed in an opening of the fourth dielectric layer 144, and may be electrically connected to an exposed portion of the bottommost circuit layer (e.g., the third circuit layer 153) of the first circuit pattern structure 1 for external connection.

Figure 2:
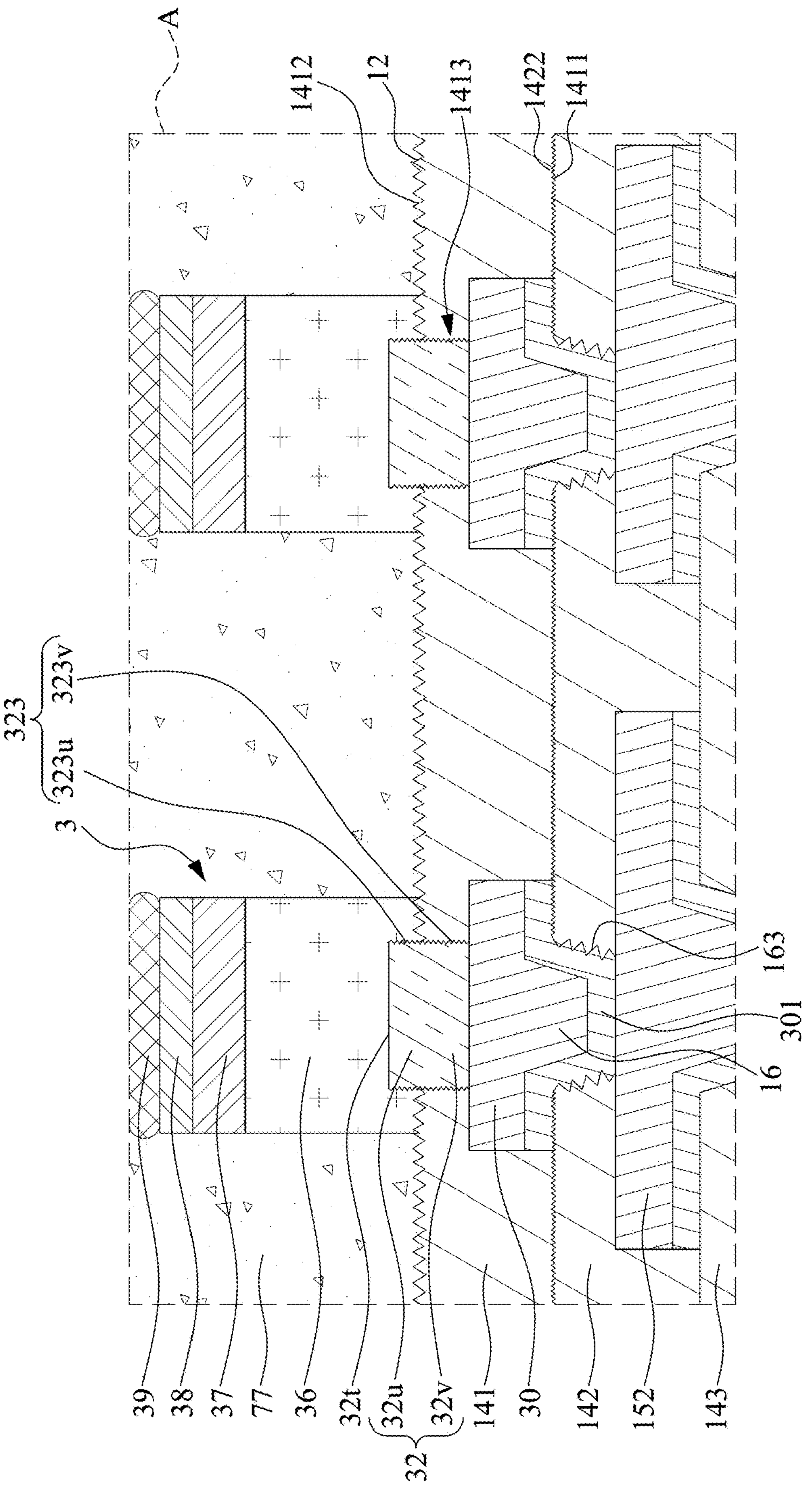
FIG. 2 illustrates an enlarged view of an area "A" of FIG. 1.

FIG. 2 illustrates an enlarged view of an area “A” of FIG. 1. As shown in FIG. 2, the pad 30 may be disposed on the second dielectric layer 142. The first dielectric layer 141 may encapsulate the pad 30, and may include or define an opening 1413 to expose a portion of the pad 30. In some embodiments, the pad 30 may include, for example, Cu, other metal, a metal alloy, other conductive material, or a combination thereof. A seed layer 301 (e.g., titanium copper) may be formed between the pad 30 and the second dielectric layer 142. The seed layer 301 may be disposed on a top surface of the second dielectric layer 142.

The bump 3 may be disposed over the pad 30. The conductive element 32 may be disposed in the opening 1413 between the pad 30 and the bump 3. The conductive element 32 may be configured to prevent the pad 30 from electrically disconnecting the bump 36 due to an expansion of the first dielectric layer 141. In some embodiments, the conductive element 32 may protrude from the pad 30, and may protrude beyond a top surface 1412 of the first dielectric layer 141. Thus, the conductive element 32 may include an upper portion **32*u* and a lower portion 32*v*. The conductive element 32 may have a lateral surface 323. The lateral surface 323 may include an upper lateral surface 323*u* corresponding to the upper portion 32*u* and a lower lateral surface 323*v* corresponding to the lower portion 32*v*. The lower portion 32*v* of the conductive element 32 may be surrounded by the first dielectric layer 141. Thus, the lower lateral surface 323*v* of the lower portion 32*v* may be a first interface between the lower portion 32*v* of the conductive element 32 and the first dielectric layer 141, which may also correspond to the inner side wall of the opening 1413. In addition, the upper portion 32***u* of the conductive element 32 may be surrounded by the bump 3. Thus, the upper lateral surface 323*u* of the upper portion 32*u* may be a second interface between the upper portion 32*u* of the conductive element 32 and the bump 3. In some embodiments, the first interface may be aligned with the second interface. That is, the second interface between the upper portion 32*u* of the conductive element 32 and the bump 3 may be aligned with the inner sidewall of the opening 1413 of the first dielectric layer 141.

In some embodiments, a top surface 32*t* of the conductive element 32 may include a curved surface. In some embodiments, the opening 1413 of the first dielectric layer 141 may be defined and determined by the conductive element 32. In some embodiments, the conductive element 32 may be configured to boost or increase a height of the pad 30 to ensure the electrical connection and/or physical connection between the bump 3 and the pad 30. In some embodiments, the conductive element 32 may be inserted into the bump 3. The conductive element 32 may be configured to inhibit tilt of the bump 3. Thus, the conductive element 32 may be configured to enhance reliability of connection between the bump 3 and the conductive element 32. In some embodiments, a top surface of the bump 3 may include a convex surface. In some embodiments, the bump 3 may be a three-layered structure, and may include a first layer, a second layer 37 and a third layer 38. The first layer 36 may include a copper layer. The second layer 37 may include a nickel layer. The third layer 38 may include a gold layer. Alternatively, the third layer 38 may include a tin-silver (SnAg) layer.

In some embodiments, a surface roughness $Ra_3$ of a top surface 1412 of the first dielectric layer 141 may be greater than a surface roughness $Ra_4$ of a bottom surface 1411 of the first dielectric layer 141. In some embodiments, a surface roughness $Ra_1$ of a lateral surface 323 of the conductive element 32 may be less than a surface roughness $Ra_2$ of a lateral surface 163 of the inner via 16 under the conductive element 32.

Figure 3A:
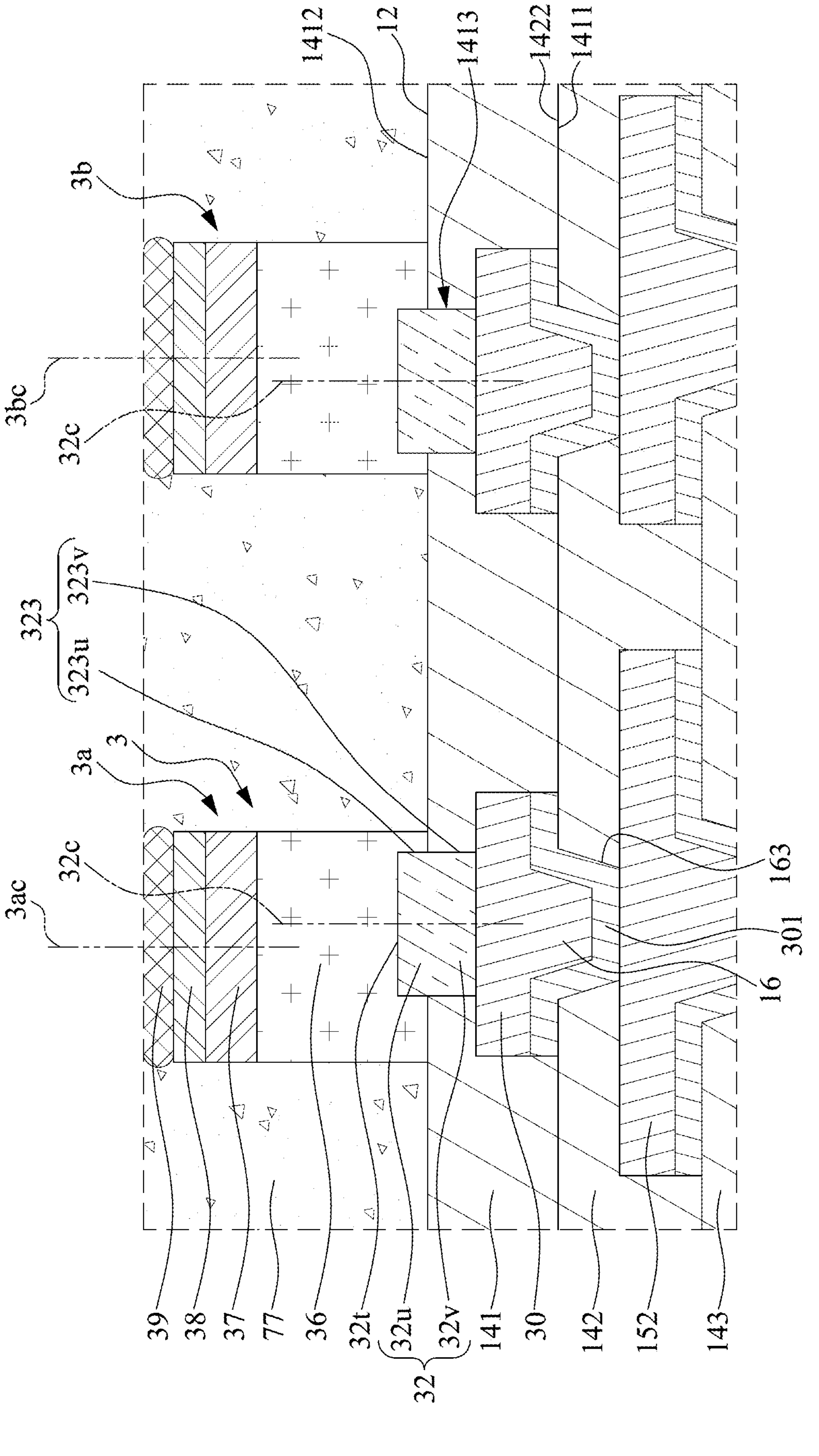
FIG. 3A illustrates a cross-sectional view of an electronic package according to some embodiments of the present disclosure.
Figure 3B:
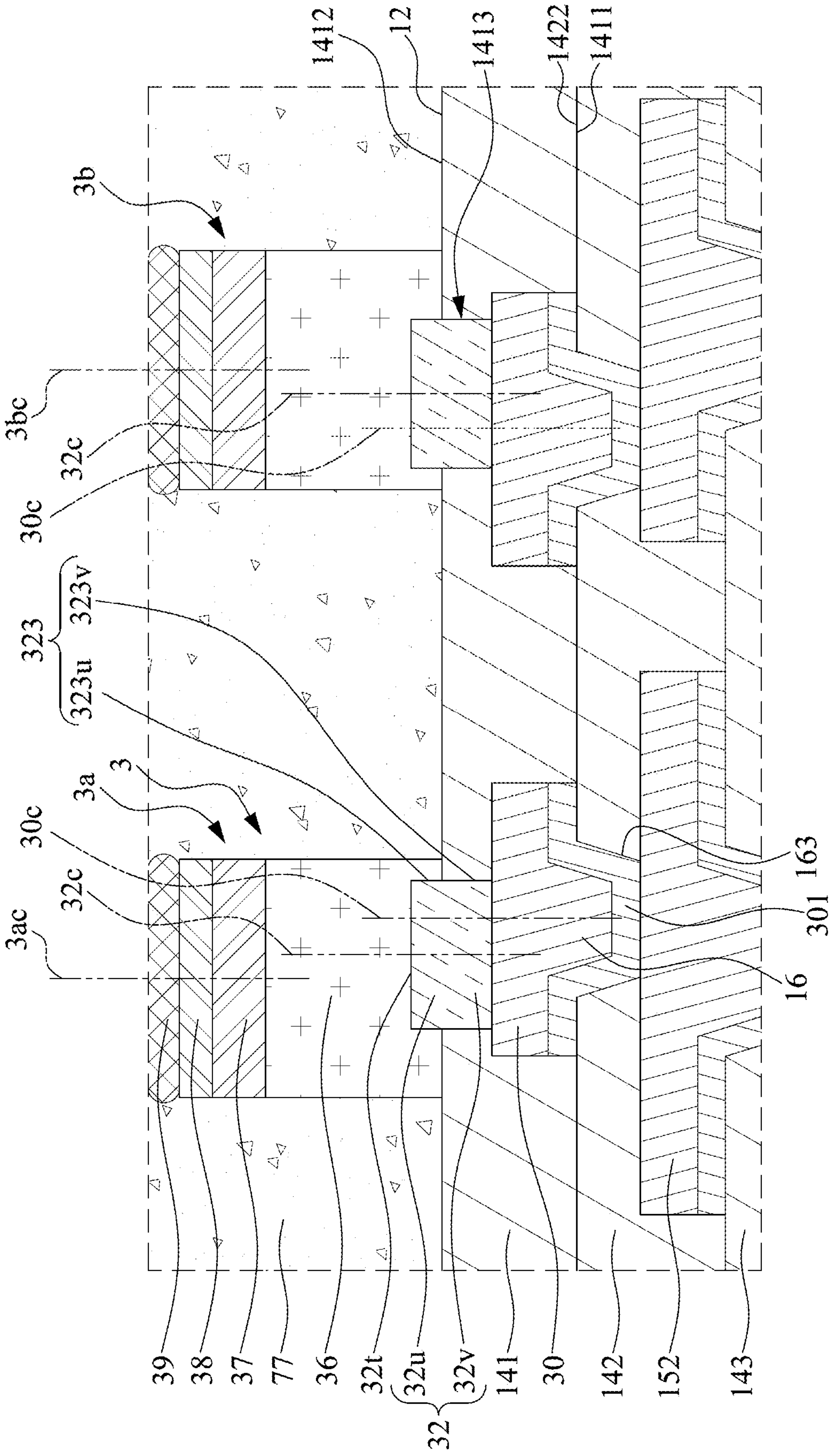
FIG. 3B illustrates a cross-sectional view of an electronic package according to some embodiments of the present disclosure.

FIG. 3A illustrates an enlarged view of an area of an electronic package according to some embodiments of the present disclosure. The structure of FIG. 3A is similar to the structure of FIG. 2. As shown in FIG. 2, the bump 3 may include a first bump 3*a* and a second bump 3*b*. A geometric center axis 3*ac* of the first bump 3*a* may be offset to the left side of a geometric center axis 32*c* of the conductive element 32. That is, the geometric center axis 3*ac* of the first bump 3*a* may be misaligned with the geometric center axis 32*c* of the conductive element 32. In addition, a geometric center axis 3*bc* of the second bump 3*b* may be offset to the right side of the geometric center axis 32*c* of the conductive element 32, That is, the geometric center axis 3*bc* of the second bump 3*b* may be misaligned with the geometric center axis 32*c* of the conductive element 32, FIG. 3B illustrates an enlarged view of an area of an electronic package according to some embodiments of the present disclosure. The structure of FIG. 3B is similar to the structure of FIG. 3A. As shown in FIG. 3B, the geometric center axis 3*ac* of the first bump 3*a*, the geometric center axis 32*c* of the conductive element 32 and a geometric center axis 30*c* of the pad 30 are misaligned with each other. In addition, the geometric center axis 3*bc* of the second bump 3*b*, the geometric center axis 32*c* of the conductive element 32 and a geometric center axis 30*c* of the pad 30 are misaligned with each other.

Figure 3C:
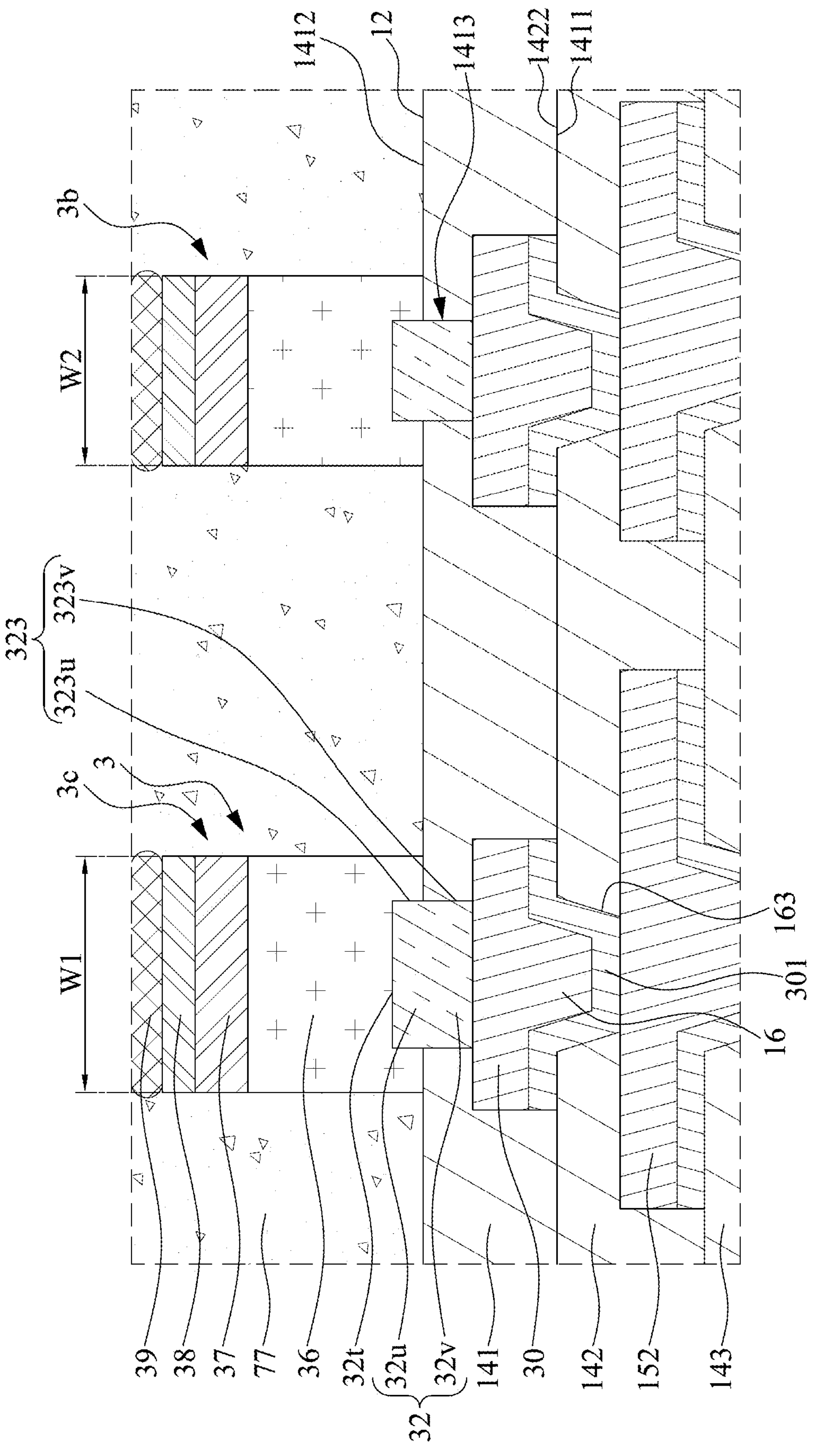
FIG. 3C illustrates a cross-sectional view of an electronic package according to some embodiments of the present disclosure.

FIG. 3C illustrates an enlarged view of an area of an electronic package according to some embodiments of the present disclosure. The structure of FIG. 3C is similar to the structure of FIG. 2. As shown in FIG. 3C, the bump 3 may include a first bump 3*c* and a second bump 3*d*. A width W1 of the first bump 3*c* may be greater than a width W2 of the second bump 3*d*.

Figure 3D:
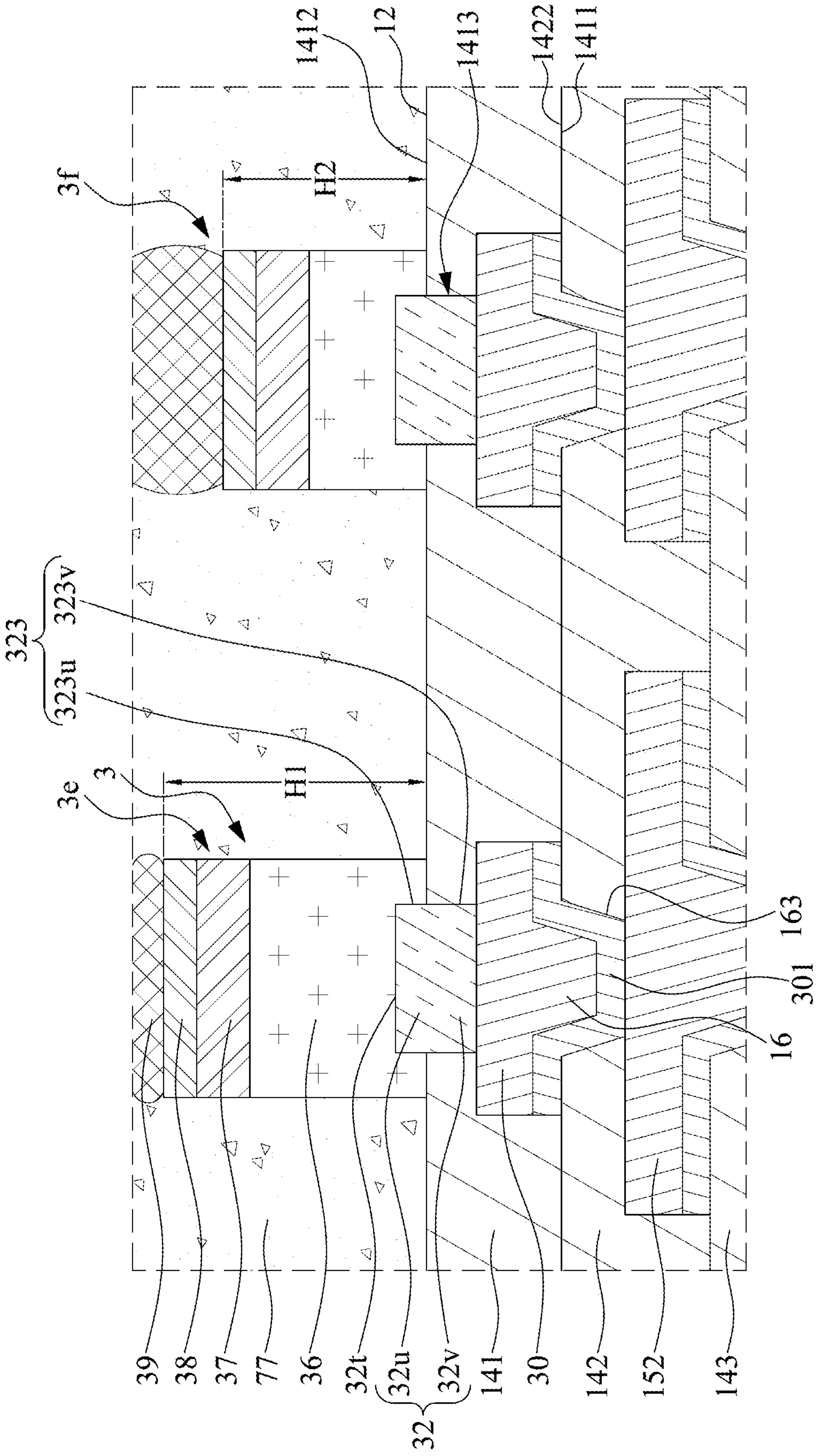
FIG. 3D illustrates a cross-sectional view of an electronic package according to some embodiments of the present disclosure.

FIG. 3D illustrates an enlarged view of an area of an electronic package according to some embodiments of the present disclosure. The structure of FIG. 3D is similar to the structure of FIG. 2. As shown in FIG. 3D, the bump 3 may include a first bump 3*e* and a second bump 3*f*. A height H1 of the first bump 3*e* may be greater than a height H2 of the second bump 3*f*.

Figure 3E:
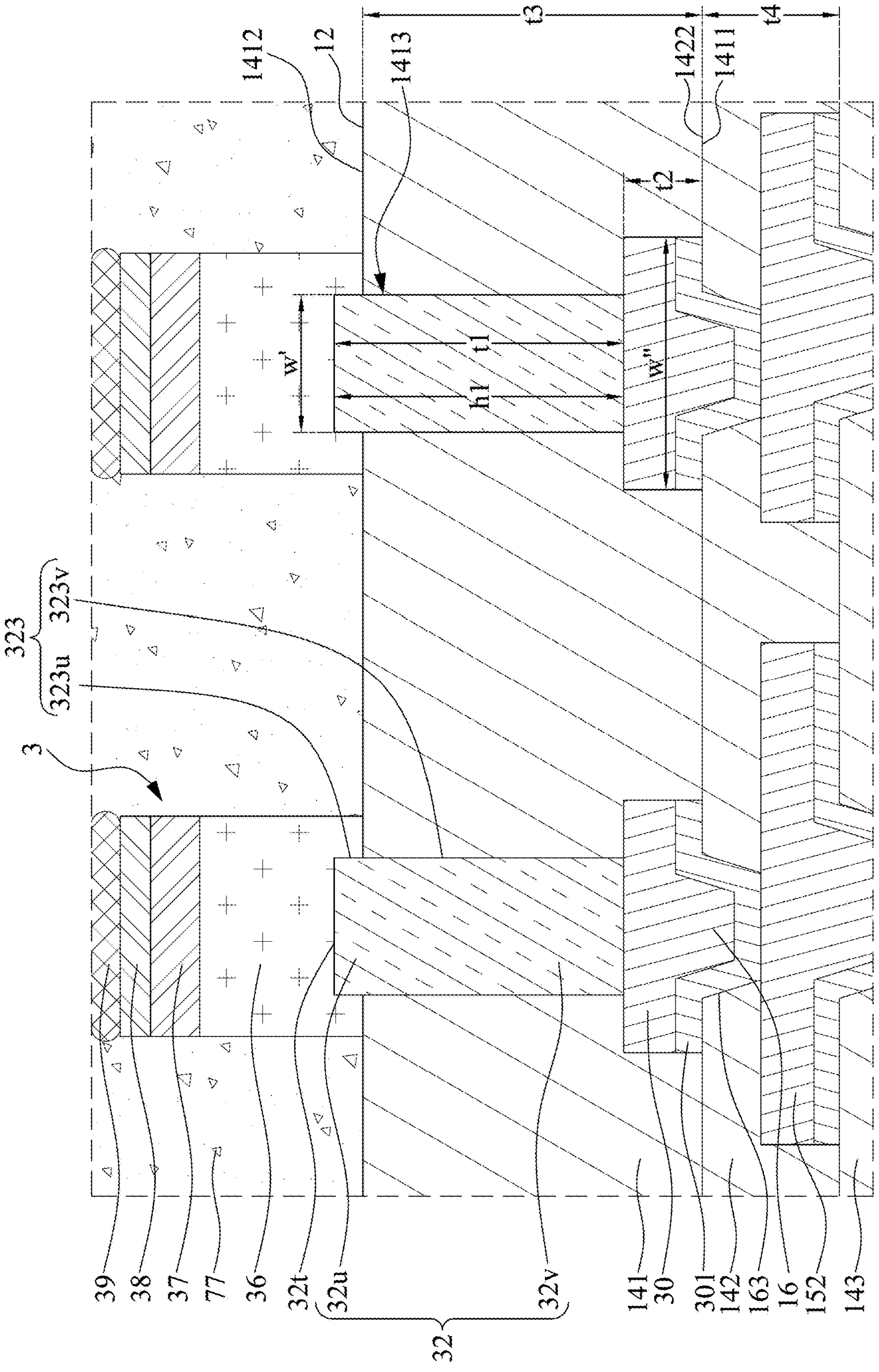
FIG. 3E illustrates a cross-sectional view of an electronic package according to some embodiments of the present disclosure.

FIG. 3E illustrates an enlarged view of an area of an electronic package according to some embodiments of the present disclosure. The structure of FIG. 3E is similar to the structure of FIG. 2. As shown in FIG. 3E, a thickness t1 of the conductive element 32 is greater than a thickness t2 of the pad 30. A height h1 of the conductive element 32 is greater than a width W' of the conductive element 32. A thickness t3 of the first dielectric layer 141 is greater than a width W" of the pad 30. The thickness t3 of the first dielectric layer 141 is greater than the thickness t2 of the pad 30. The thickness t3 of the first dielectric layer 141 is greater than a thickness t4 of the second dielectric layer 142

Figure 4A:
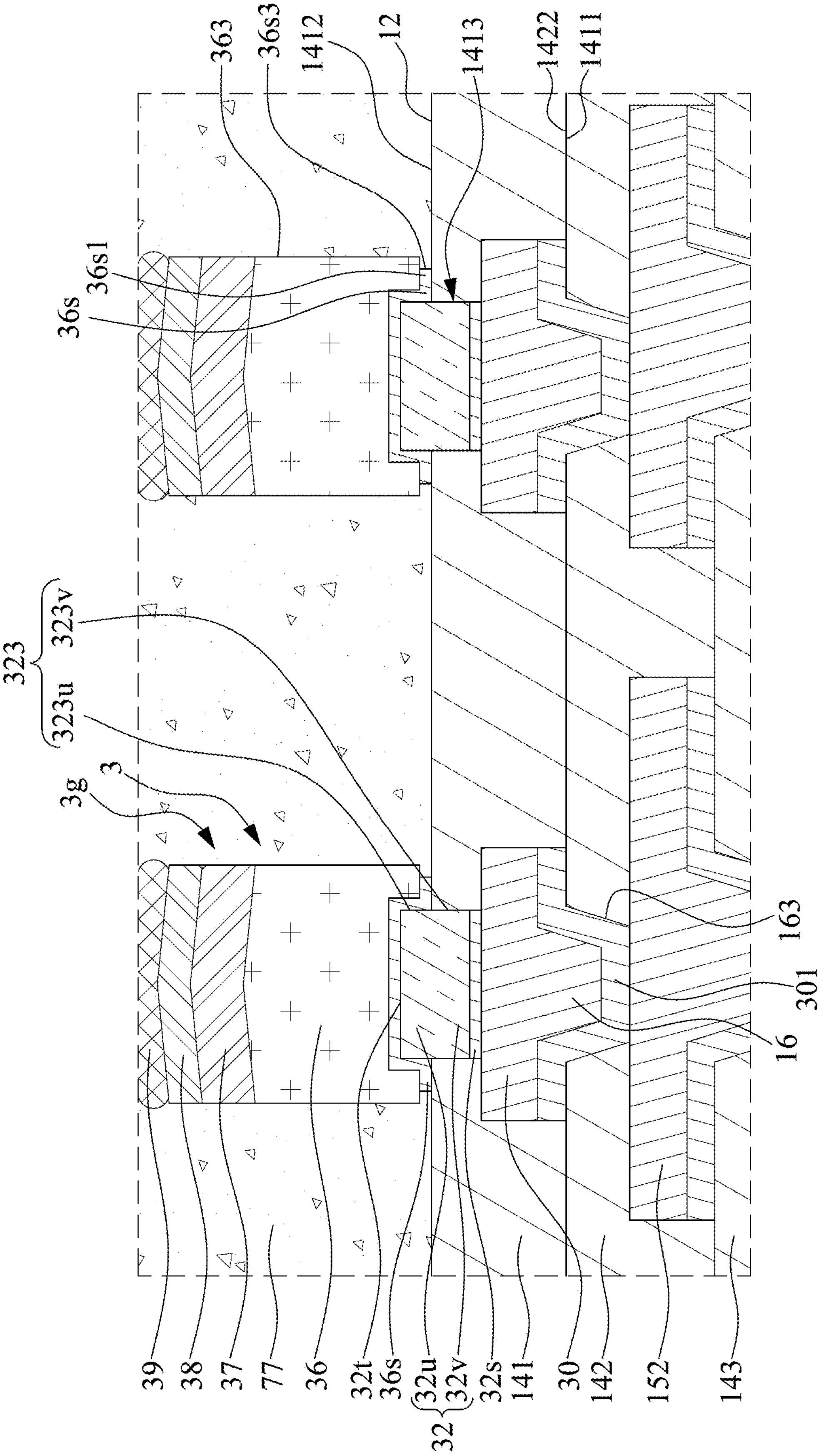
FIG. 4A illustrates a cross-sectional view of an electronic package according to some embodiments of the present disclosure.

FIG. 4A illustrates an enlarged view of an area of an electronic package according to some embodiments of the present disclosure. The structure of FIG. 4A is similar to the structure of FIG. 2. As shown in FIG. 4A, a seed layer 36*s* may be disposed between the conductive element 32 and the bump 3*g*. The seed layer 36*s* may cover the upper portion 32*u* of the conductive element 32 and a portion of the top surface 1412 of the first dielectric layer 141. In some embodiments, a top surface of the bump 3*g* includes a convex surface. In some embodiments, a top surface of the first layer 36 may include a convex surface, a top surface of the second layer 37 may include a convex surface, and a top surface of the third layer 38 may include a convex surface. In some embodiments, the seed layer 36*s* may include a first portion 36*s*1 disposed between the first dielectric layer 141 and the bump 3*g*. A lateral surface 36*s*3 of the first portion 36*s*1 of the seed layer 36*s* is recessed from a lateral surface 363 of the bump 3*g*. In addition, a seed layer 32*s* may be disposed between the conductive element 32 and the pad 30.

Figure 4B:
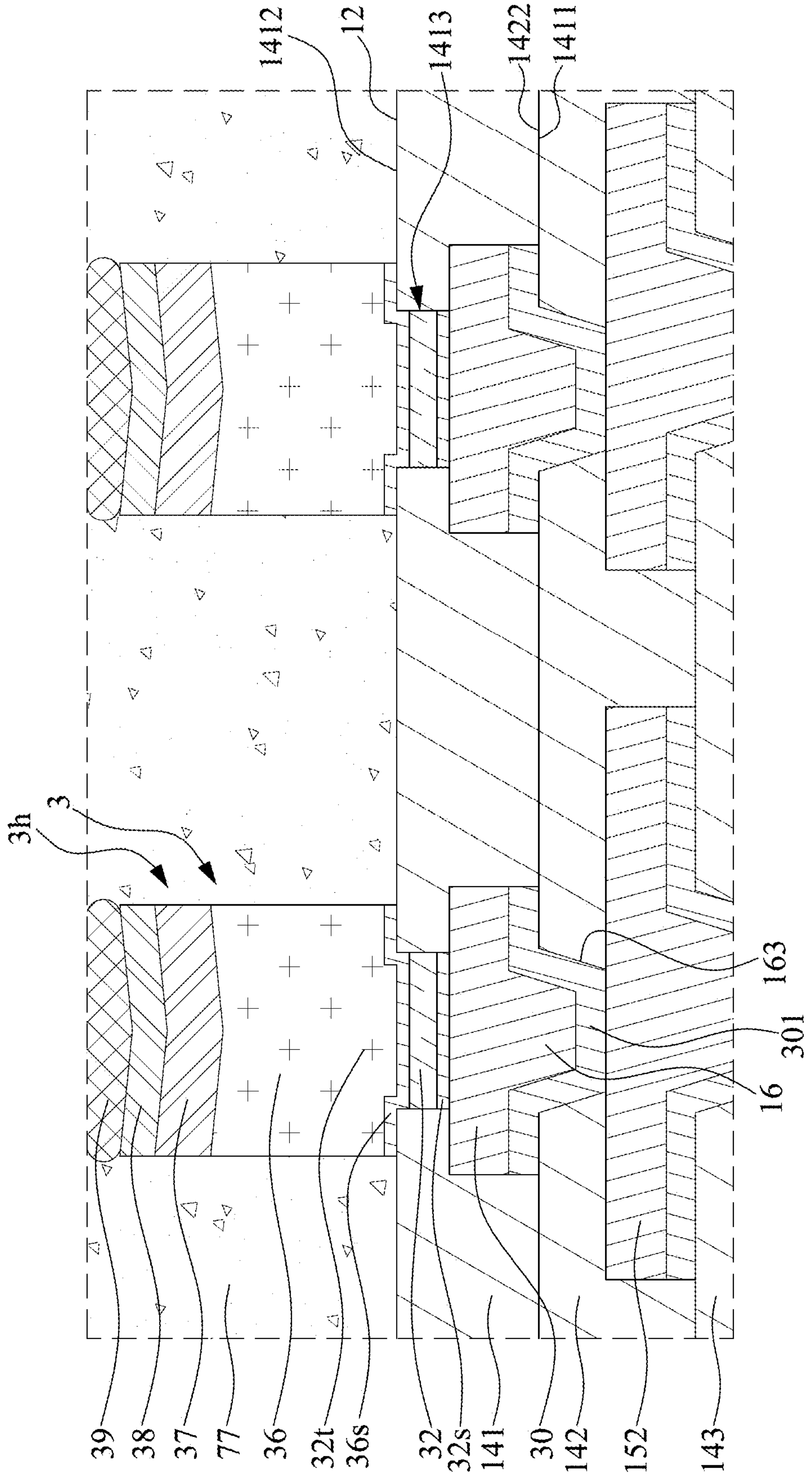
FIG. 4B illustrates a cross-sectional view of an electronic package according to some embodiments of the present disclosure.

FIG. 4B illustrates an enlarged view of an area of an electronic package according to some embodiments of the present disclosure. The structure of FIG. 4B is similar to the structure of FIG. 4A. As shown in FIG. 4B, the conductive element 32 may be recessed from the top surface 1412 of the first dielectric layer 141. In some embodiments, a top surface of the bump 3*h* may include a concave surface. In some embodiments, a top surface of the first layer 36 may include a concave surface, a top surface of the second layer 37 may include a concave surface, and a top surface of the third layer 38 may include a concave surface.

Figure 5A:
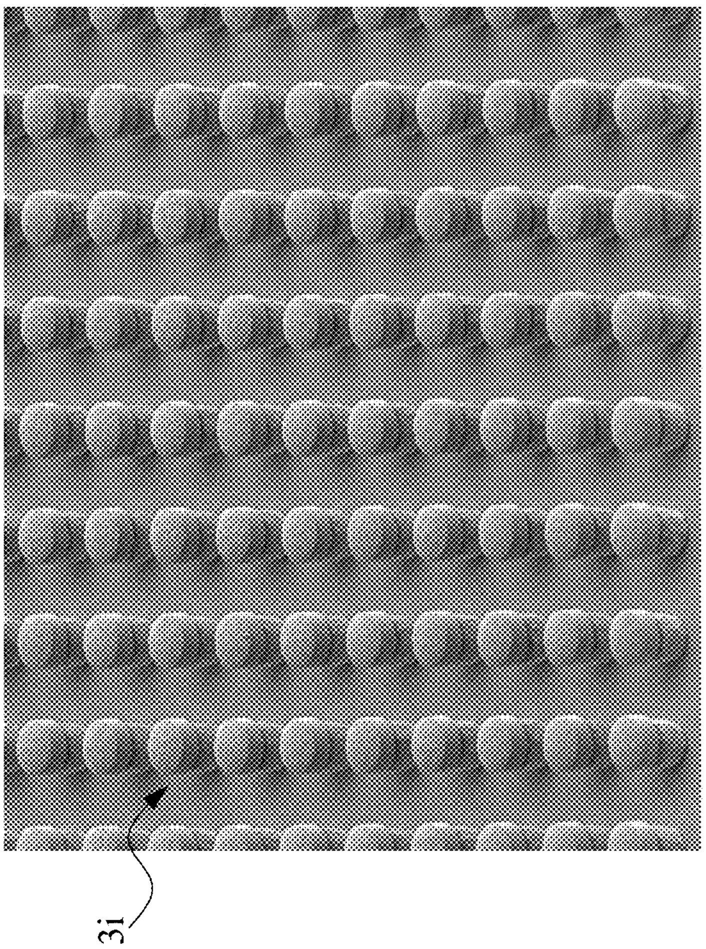
FIG. 5A illustrates a top view of electronic packages according to some embodiments of the present disclosure.
Figure 5B:
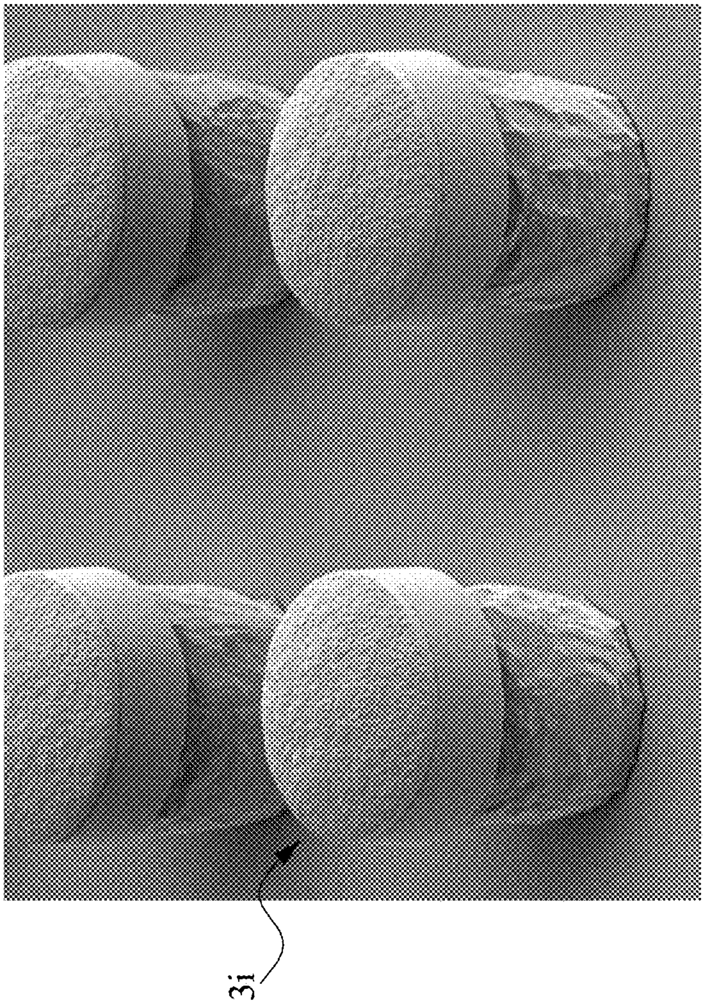
FIG. 5B illustrates an enlarged view of a top view of FIG. 5A.
Figure 5C:
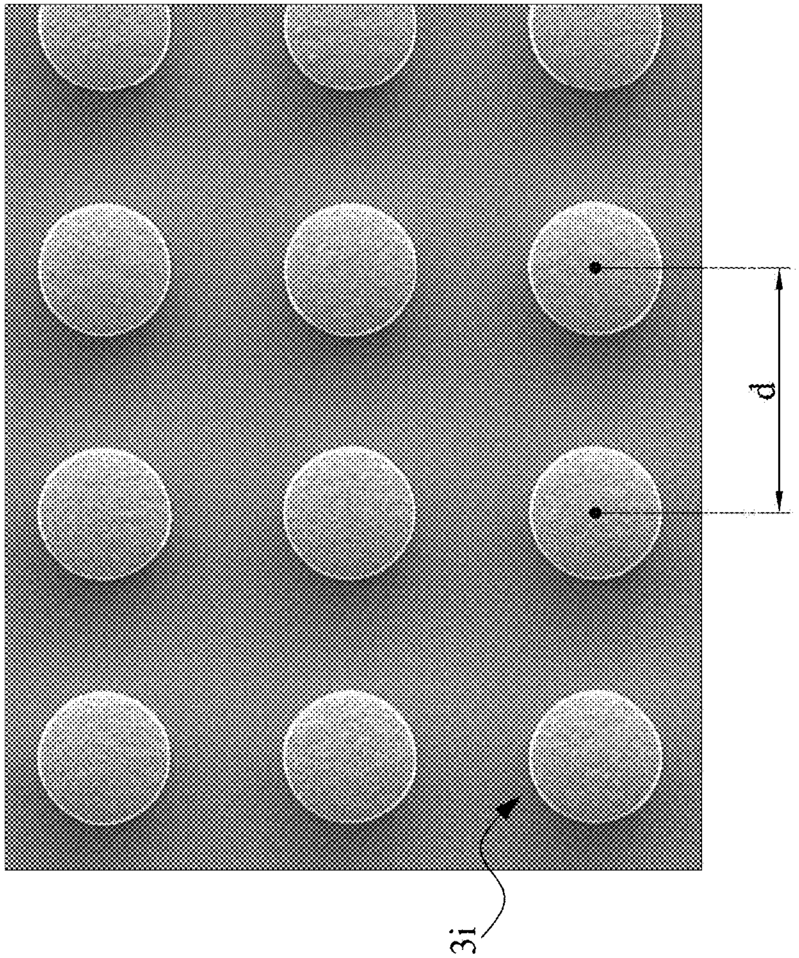
FIG. 5C illustrates a top view of electronic packages according to some embodiments of the present disclosure.

FIG. 5A illustrates a scanning electron microscope (SEM) image of a plurality of bumps 3*i* according to some embodiments of the present disclosure. FIG. 5B illustrates a partially enlarged view of FIG. 5A. FIG. 5C illustrates a top view of the bumps 3*i* of FIG. 5A. The bumps 3*i* may be arranged in an array. In some embodiments, a distance d between two geometric center axes of two adjacent bumps 3*i* may be about 12 micrometers (μm) to 16 μm. The distance d may be about 14 μm.

Figure 5D:
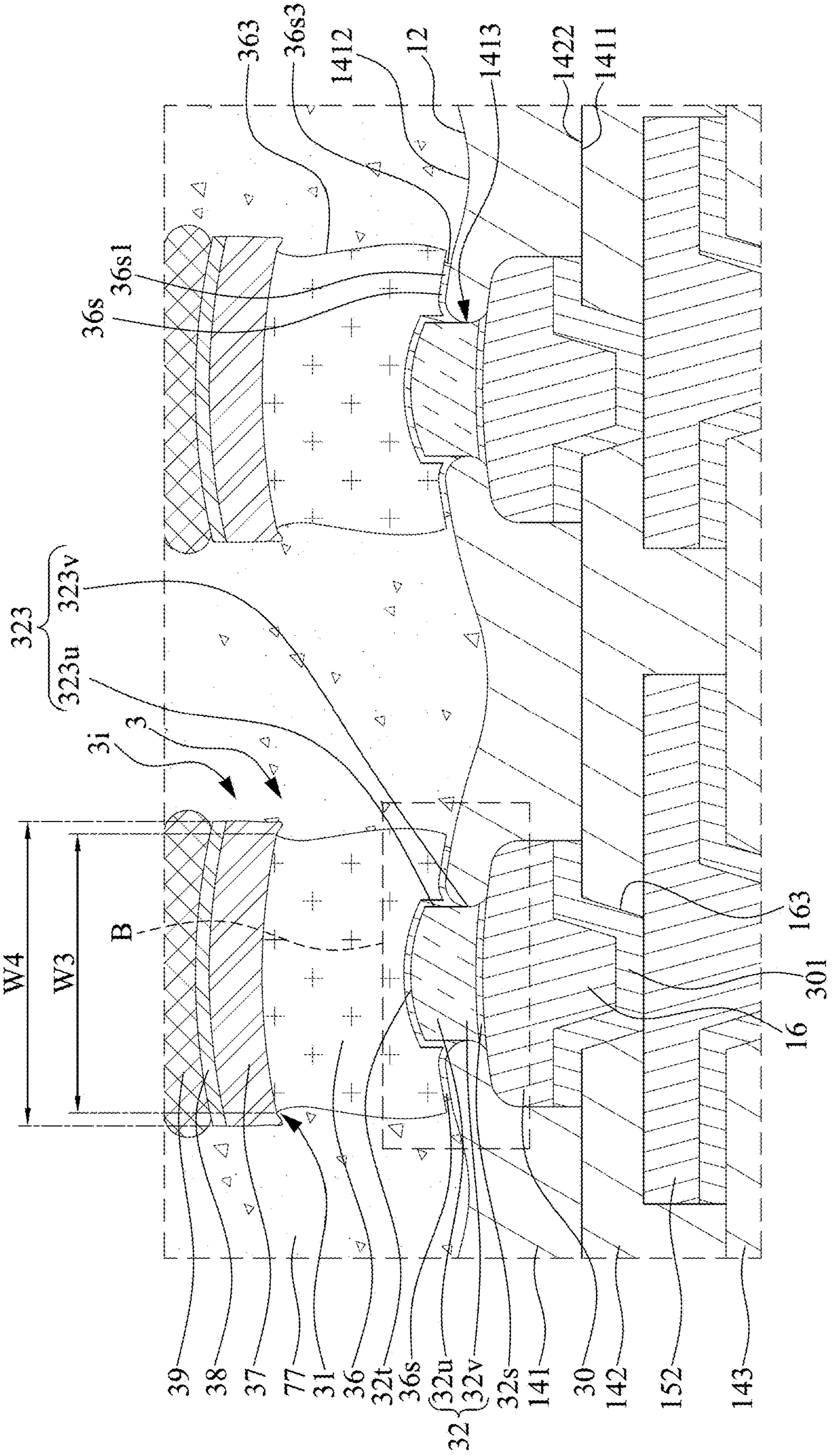
FIG. 5D illustrates a cross-sectional view of an electronic package according to some embodiments of the present disclosure.
Figure 5E:
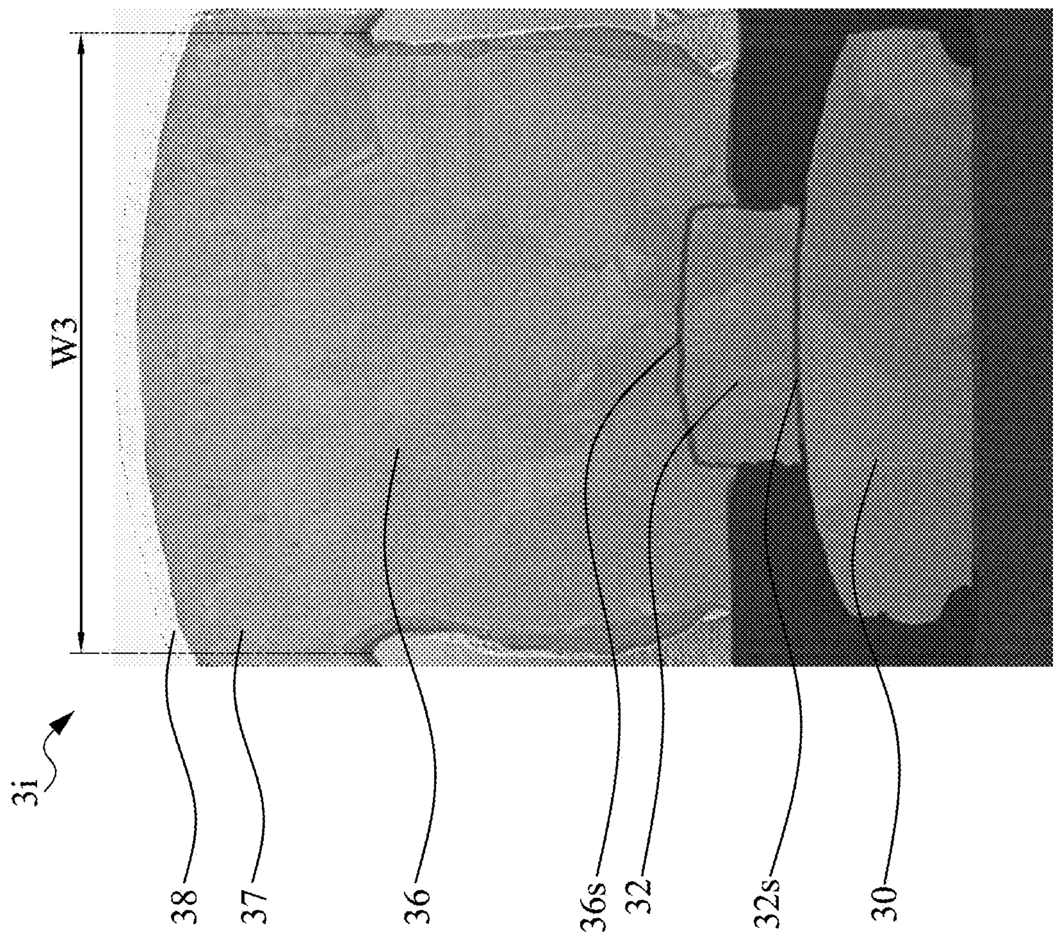
FIG. 5E illustrates a cross-sectional view of an electronic package according to some embodiments of the present disclosure.

FIG. 5D illustrates an enlarged view of an area of an electronic package according to some embodiments of the present disclosure. FIG. 5E illustrates a scanning electron microscope (SEM) image of a bump 3*i* of FIG. 5D. The structure of FIG. 5D is similar to the structure of FIG. 4A. The bump 3*i* of FIG. 5D and FIG. 5E may be the bump 3*i* of FIGS. 5A to 5C. As shown in FIG. 5D and FIG. 5E, the top surface of the pad 30 may include a curved surface. The top surface of the conductive element 32 may include a curved surface. The top surface of the bump 3*i* may include a curved surface. The seed layer 36*s* may include a first portion 36*s*1 disposed between the first dielectric layer 141 and the bump 3*i*. A lateral surface 36*s*3 of the first portion 36*s*1 of the seed layer 36*s* may be recessed from the lateral surface 363 of the bump 3*i*. A lateral width W4 of the second layer 37 is greater than a lateral width W3 of the first layer 36. Thus, an indentation 31 may be formed near the bottom corner of the second layer 37. The indentation 31 may be defined by a bottom surface of the second layer 37 and a lateral surface of the first layer 36. In some embodiments, the lateral width W3 of the first layer 36 may be 7 μm.

Figure 5F:
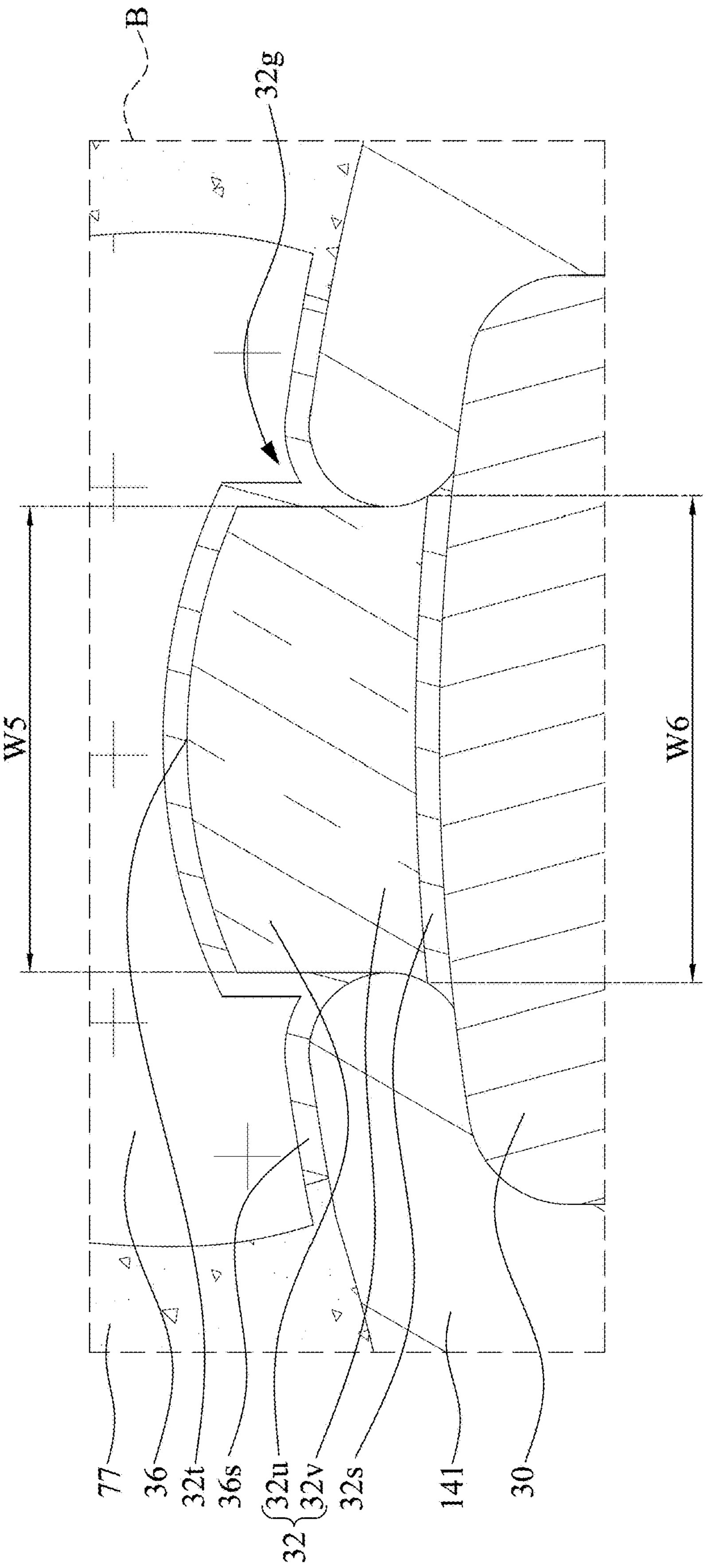
FIG. 5F illustrates a cross-sectional view of an electronic package according to some embodiments of the present disclosure.
Figure 5G:
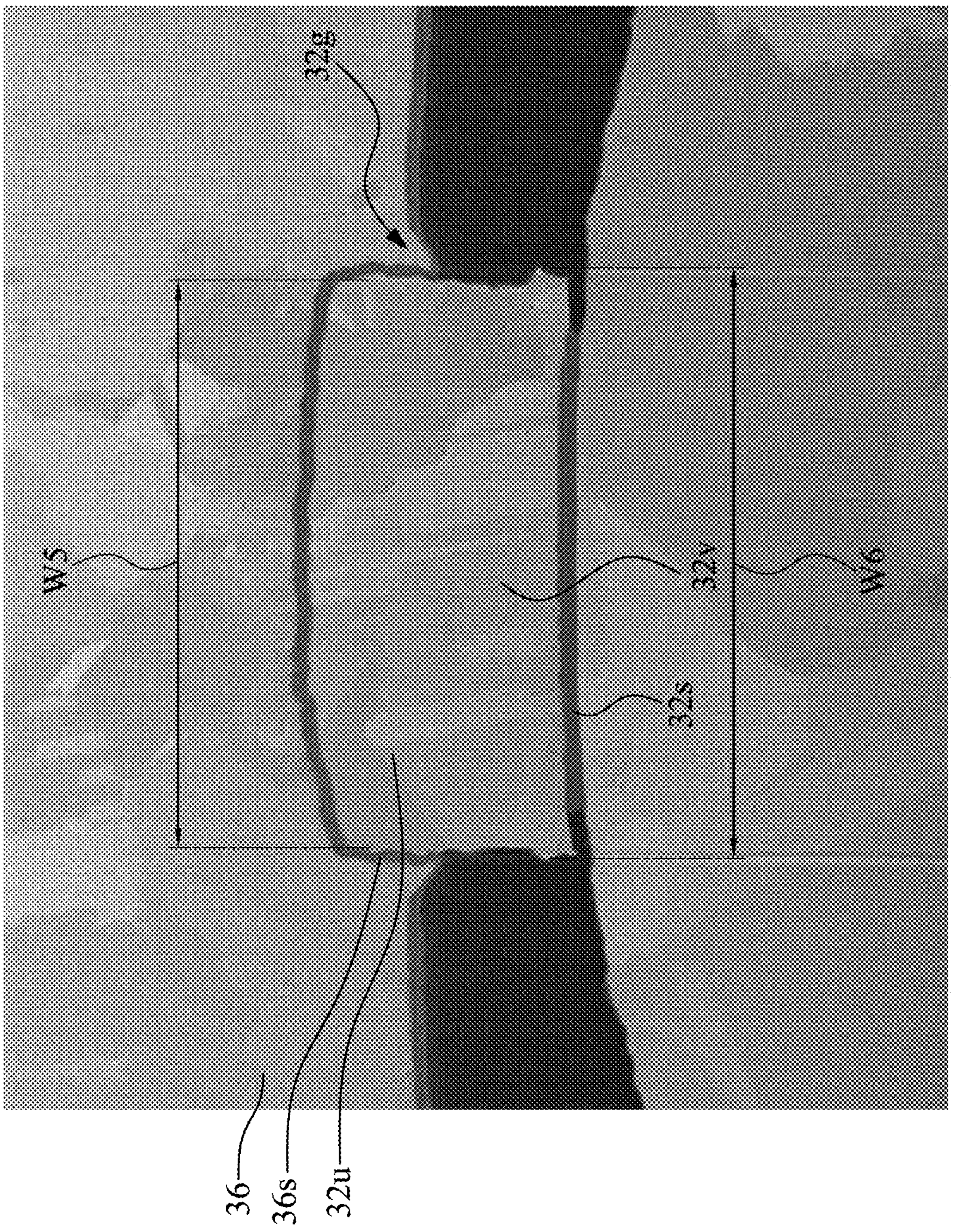
FIG. 5G illustrates a cross-sectional view of an electronic package according to some embodiments of the present disclosure.

FIG. 5F illustrates an enlarged view of an area B of FIG. 5D. FIG. 5G illustrates a scanning electron microscope (SEM) image of FIG. 5F. In some embodiments, a gap 32*g* is located disposed between the conductive element 32 and the first dielectric layer 141. A lateral width of the gap 32*g* tapers or decreases towards the pad 30 in a vertical direction. The first layer 36 of the bump 3*i* contacts the seed layer 36*s*, and a portion of the first layer 36 of the bump 36 extends into the gap 32*g*. In some embodiments, the upper portion 32*u* of the conductive element 32 is covered by the first layer 36 of the bump 3*i*, and the lower portion 32*v* of the conductive element 32 is surrounded by the first dielectric layer 141. A thickness of the lower portion 32*v* may be greater than a thickness of the upper portion 32*u*. In addition, a lateral width W6 of the lower portion 32*v* may be greater than a lateral width W5 of the upper portion 32*u*.

Figure 6A:
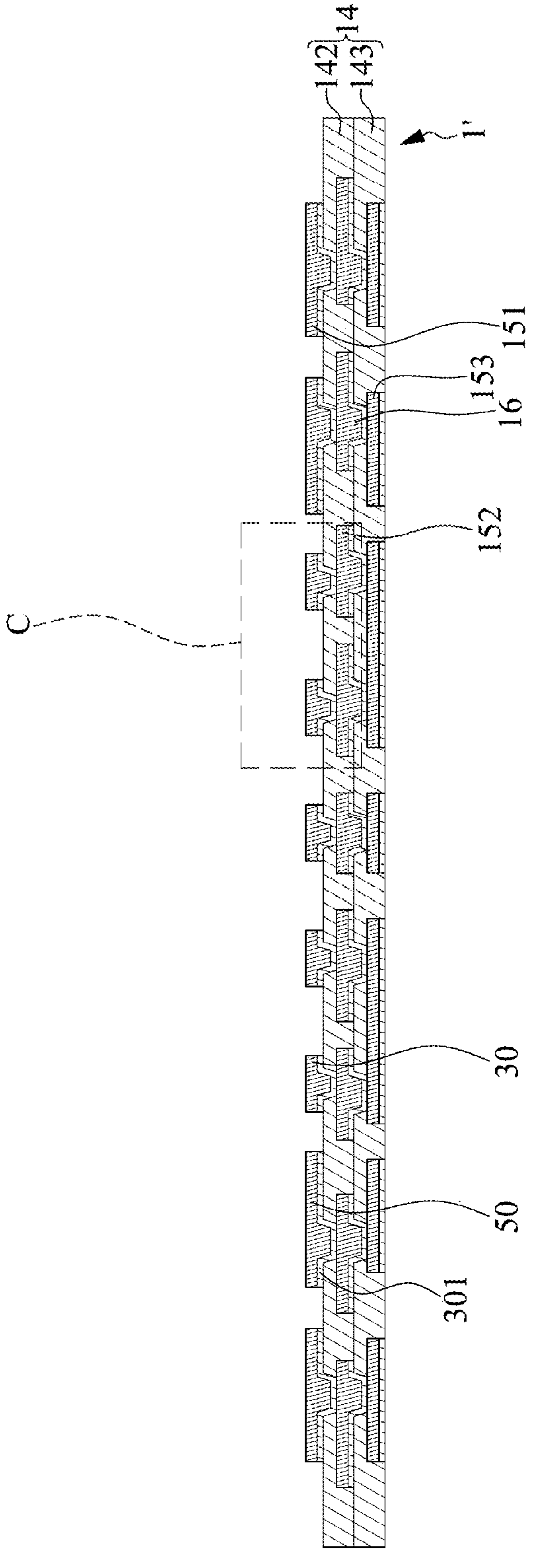
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, FIG. 6O, and FIG. 6P illustrate a method for manufacturing an electronic package according to some embodiments of the present disclosure.
Figure 6B:
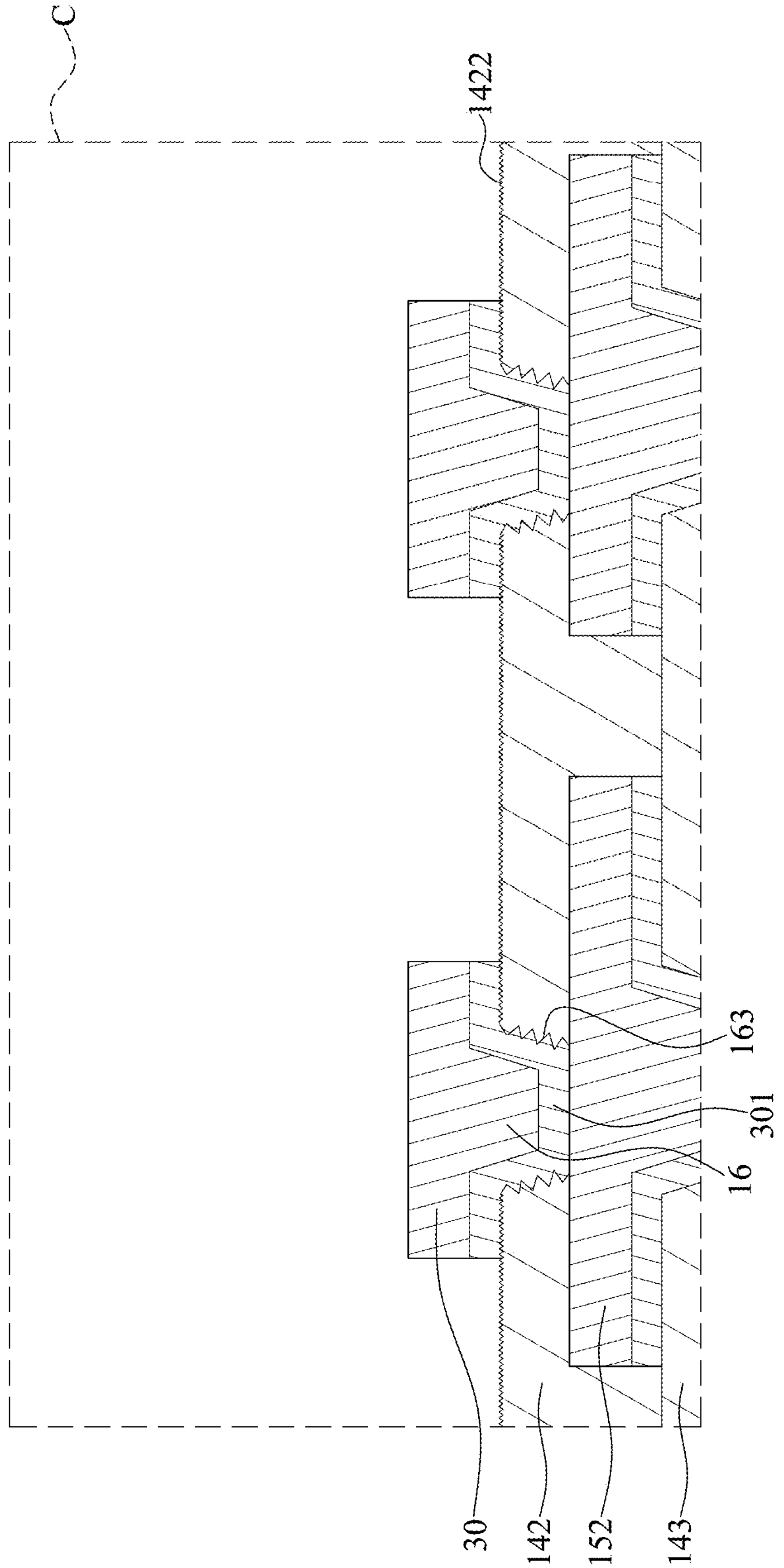
Figure 6C:
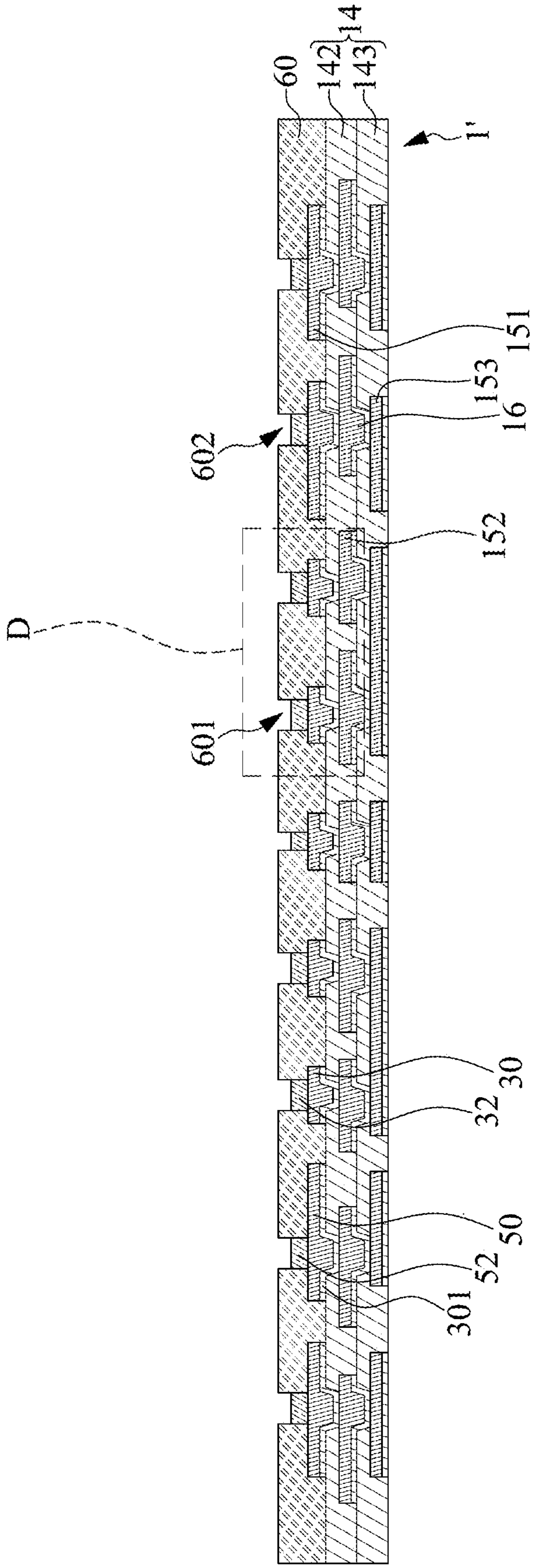
Figure 6D:
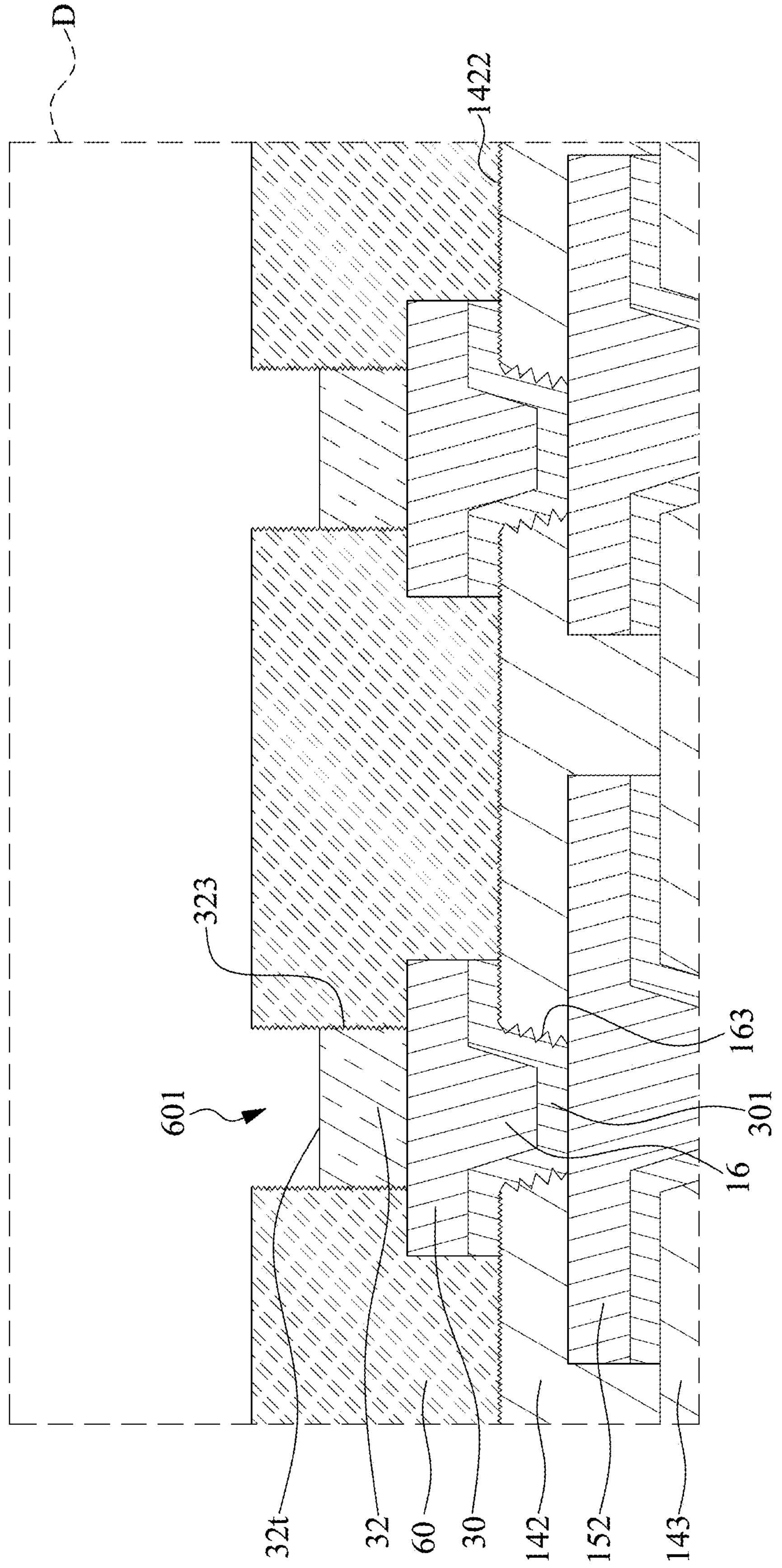
Figure 6E:
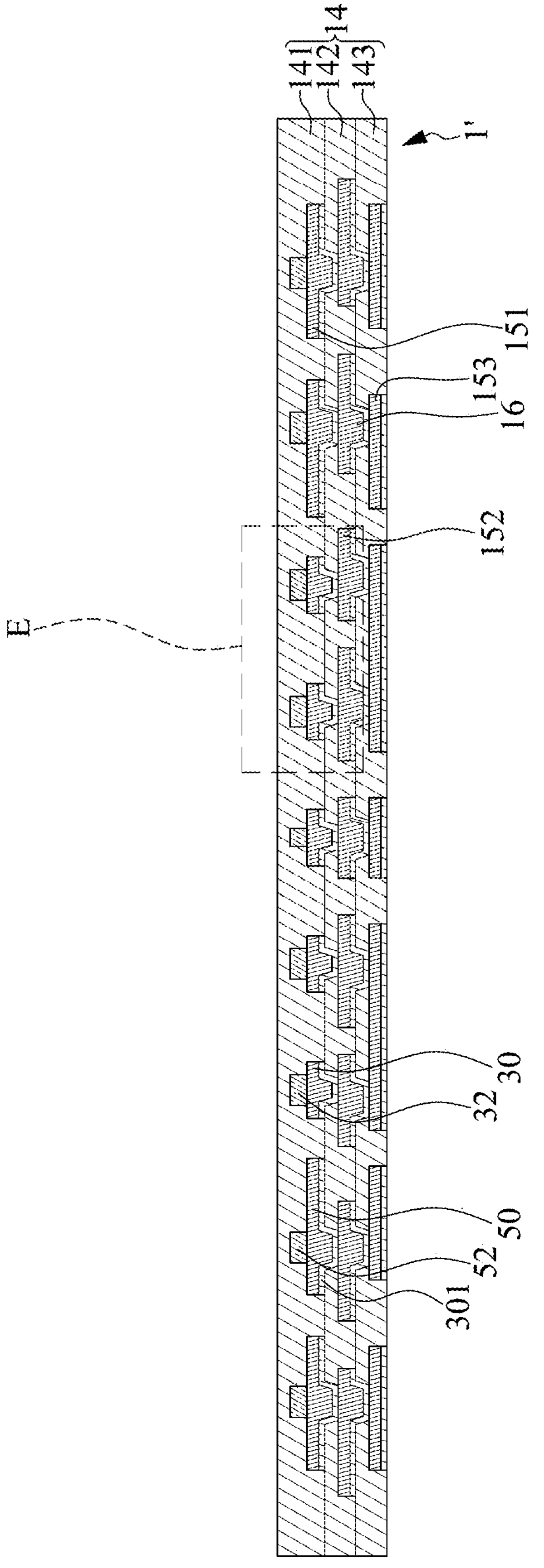
Figure 6F:
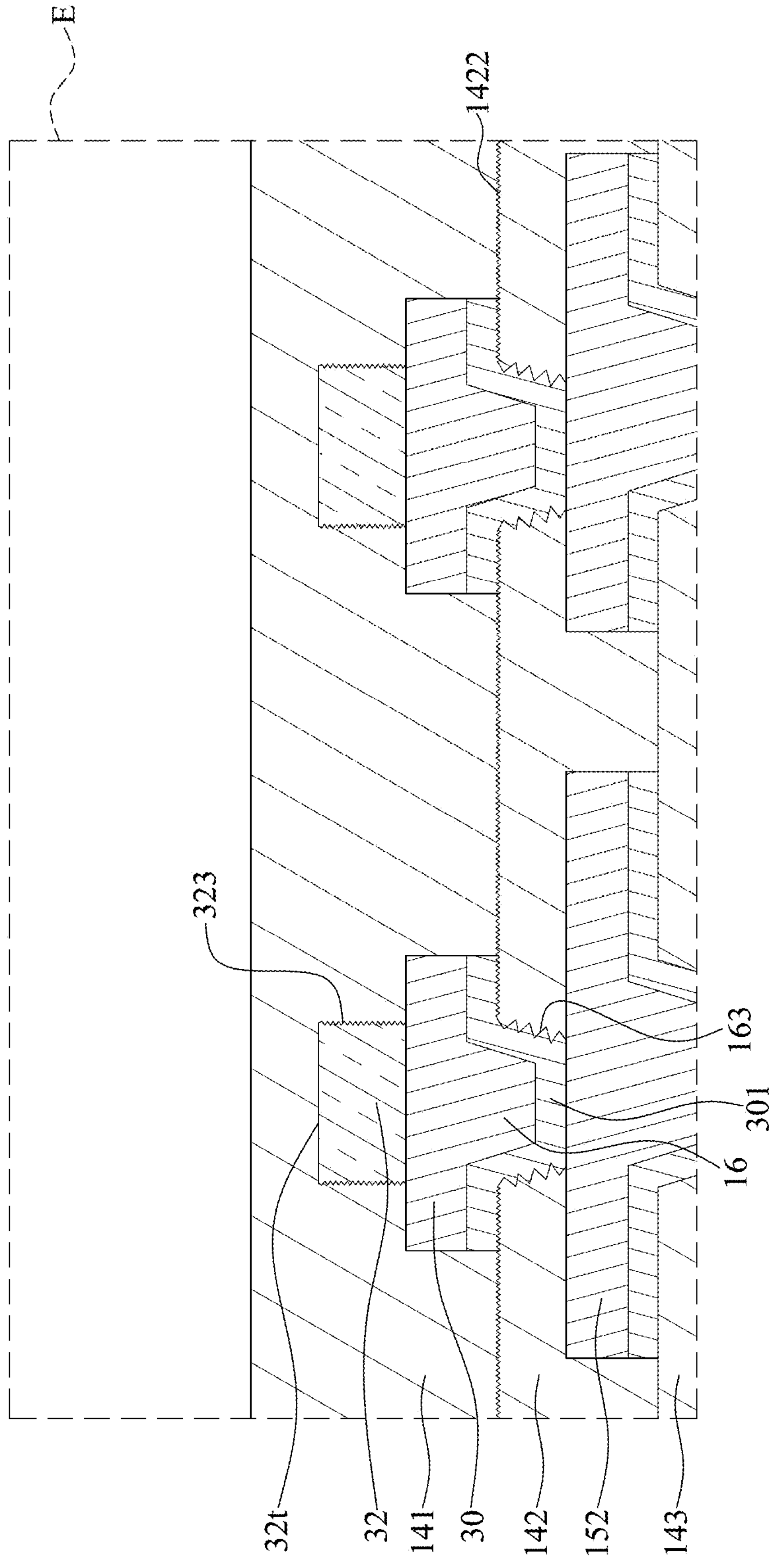
Figure 6G:
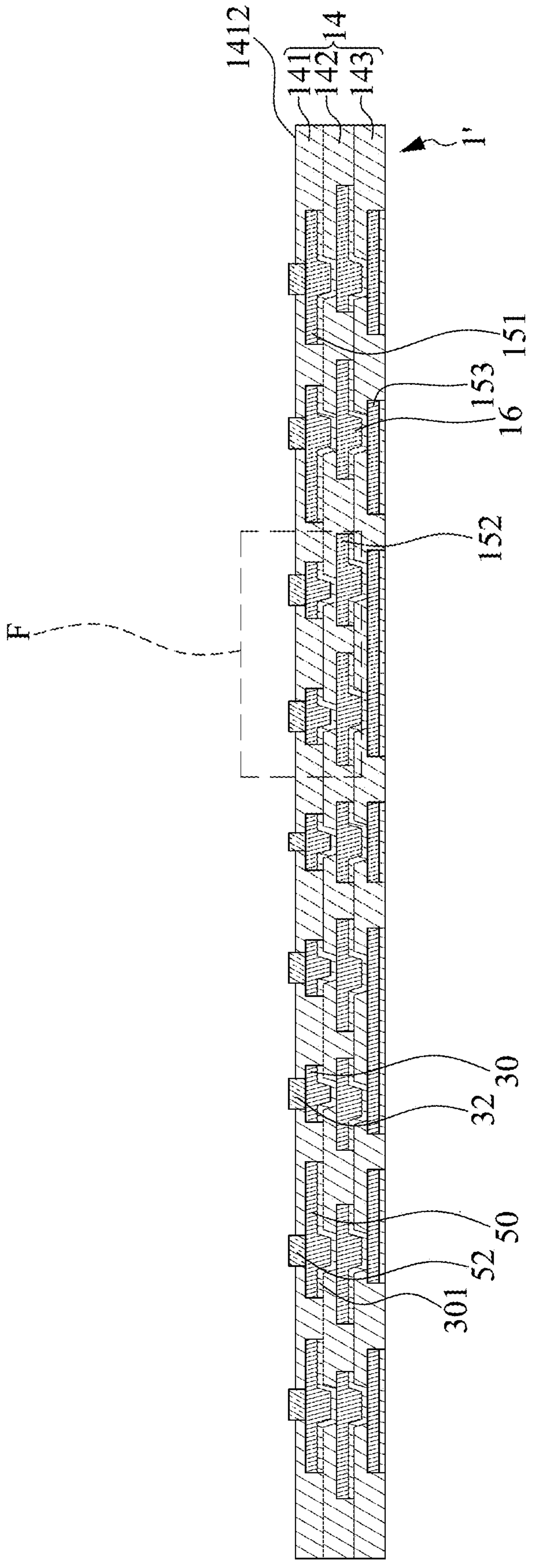
Figure 6H:
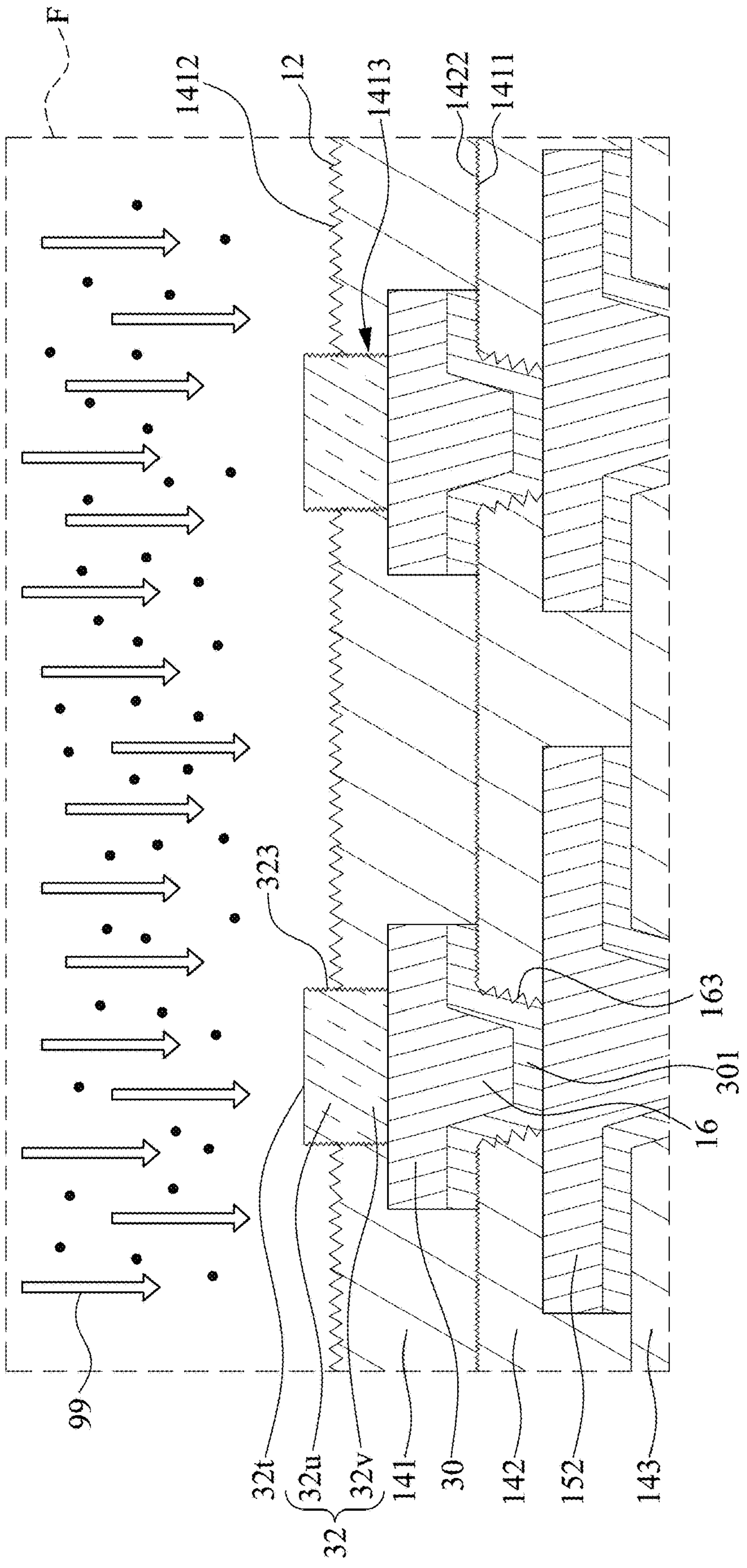
Figure 6I:
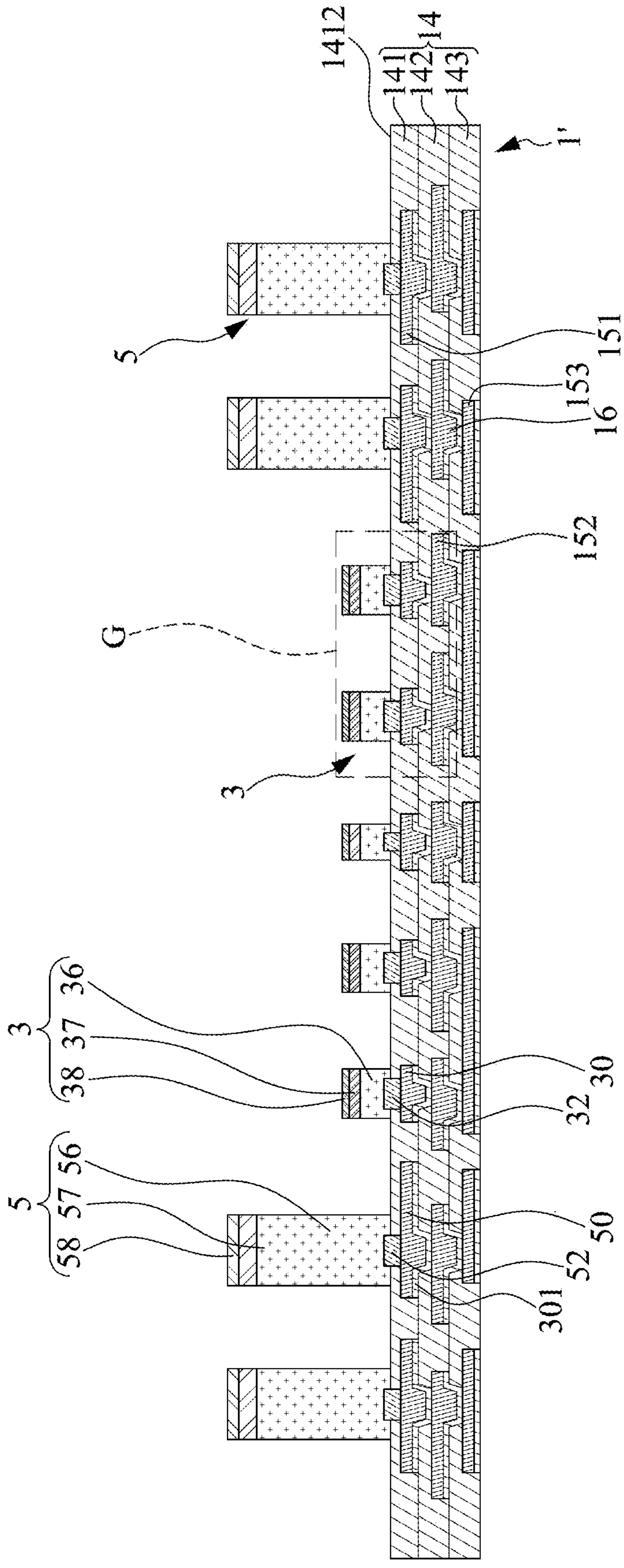
Figure 6J:
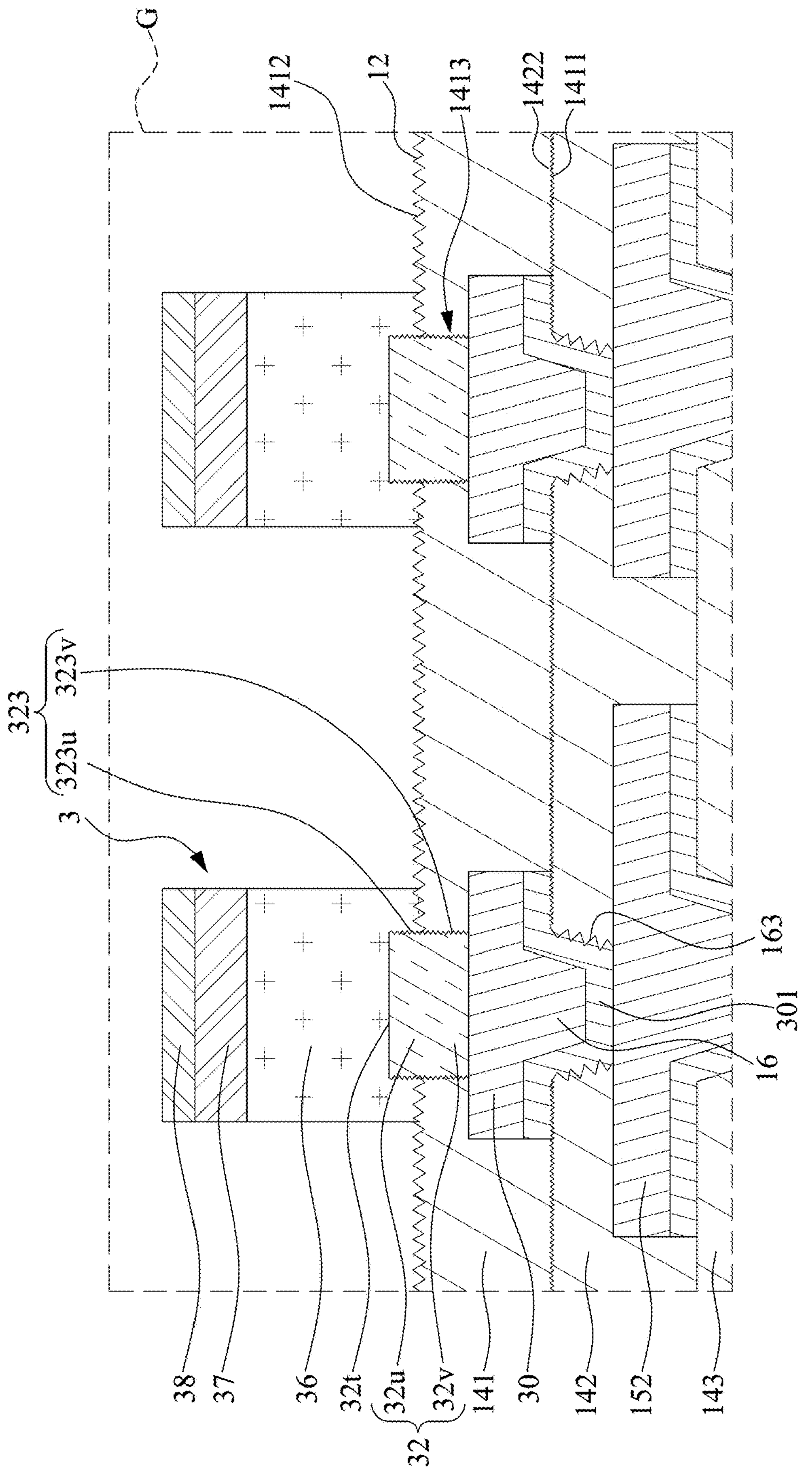
Figure 6K:
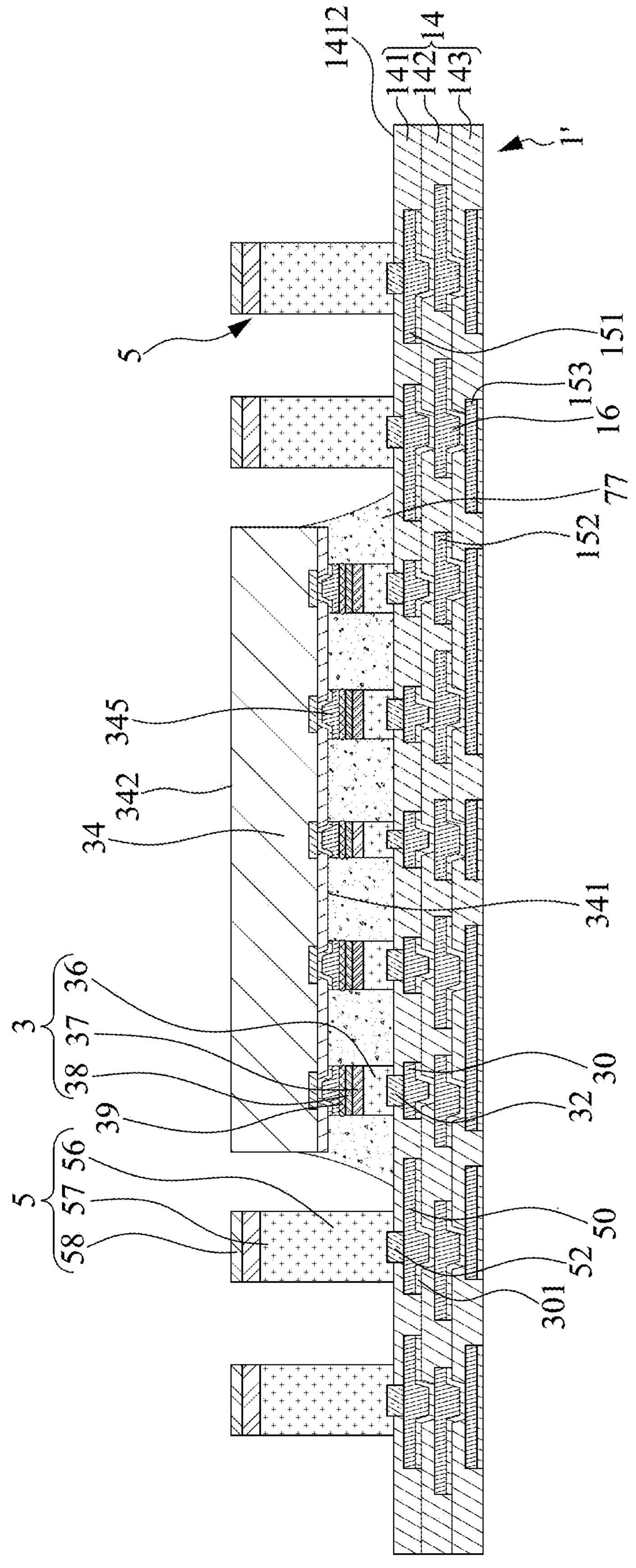
Figure 6L:
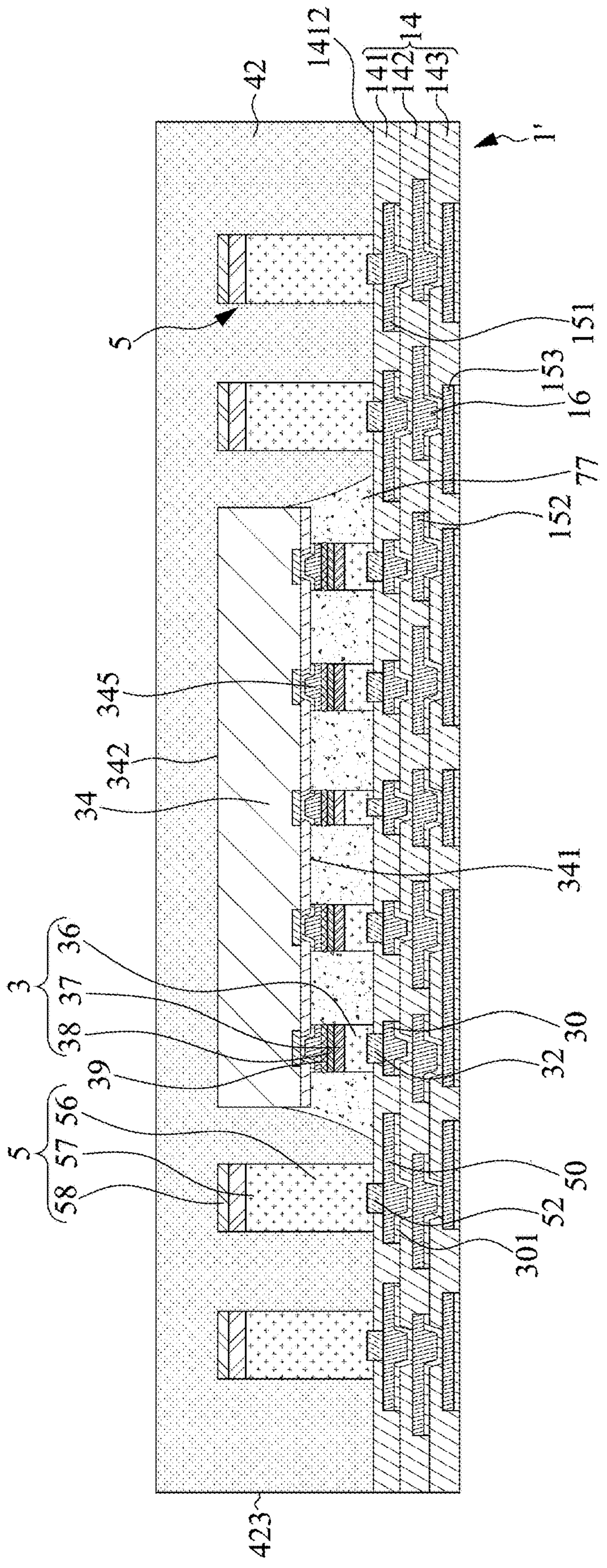
Figure 6M:
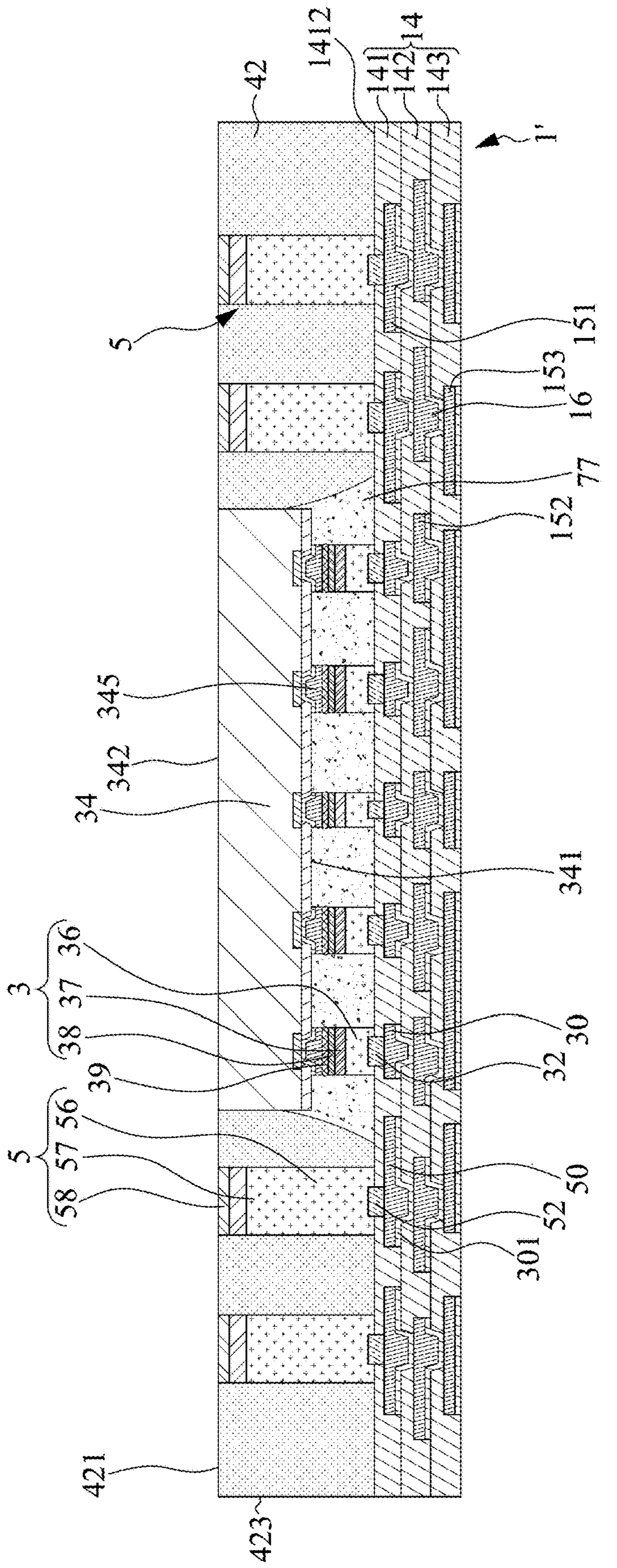
Figure 6N:
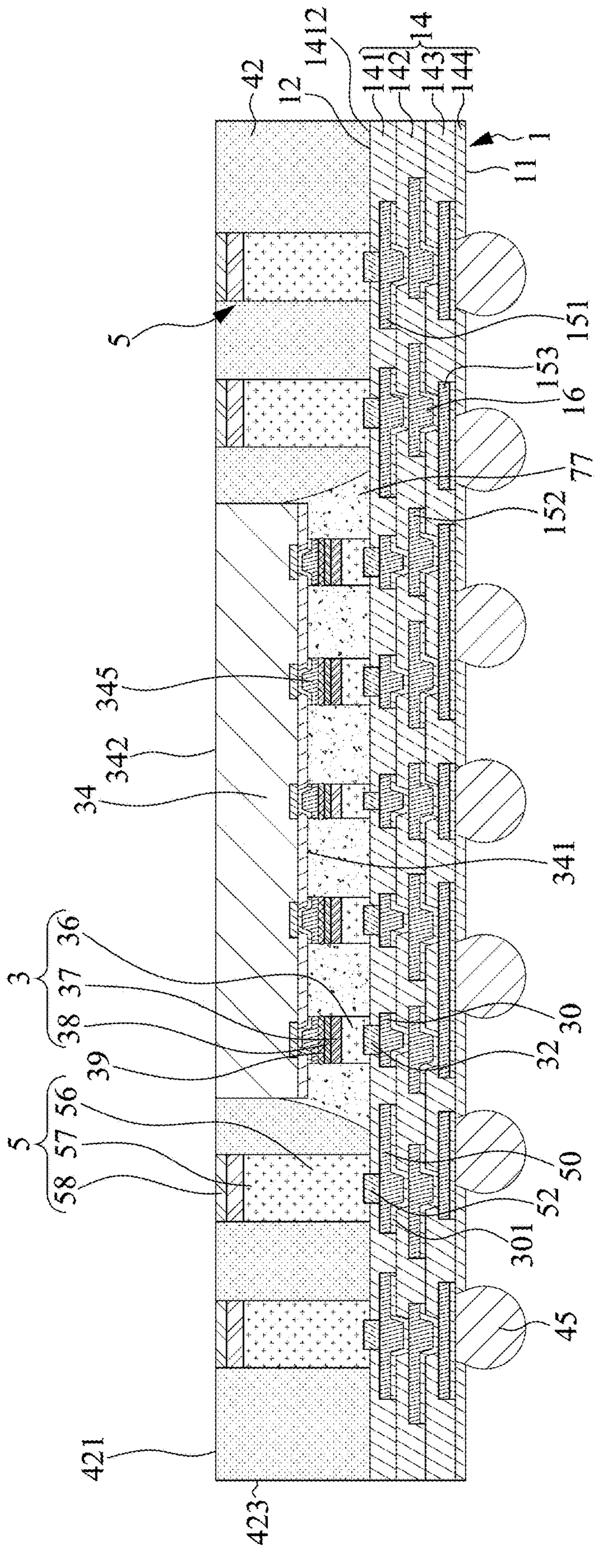
Figure 6O:
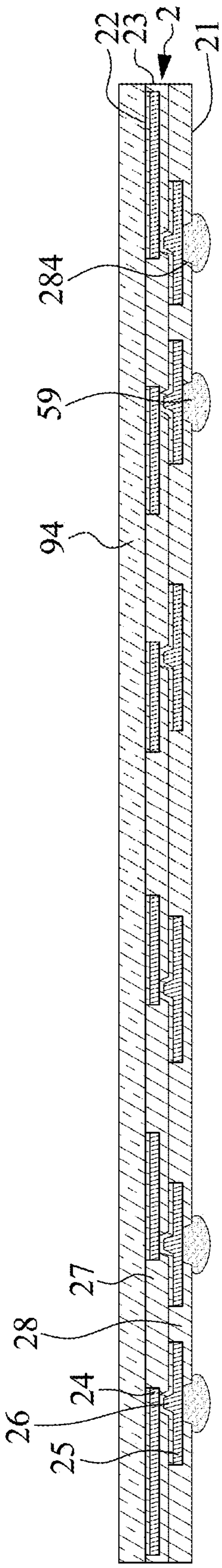
Figure 6P:
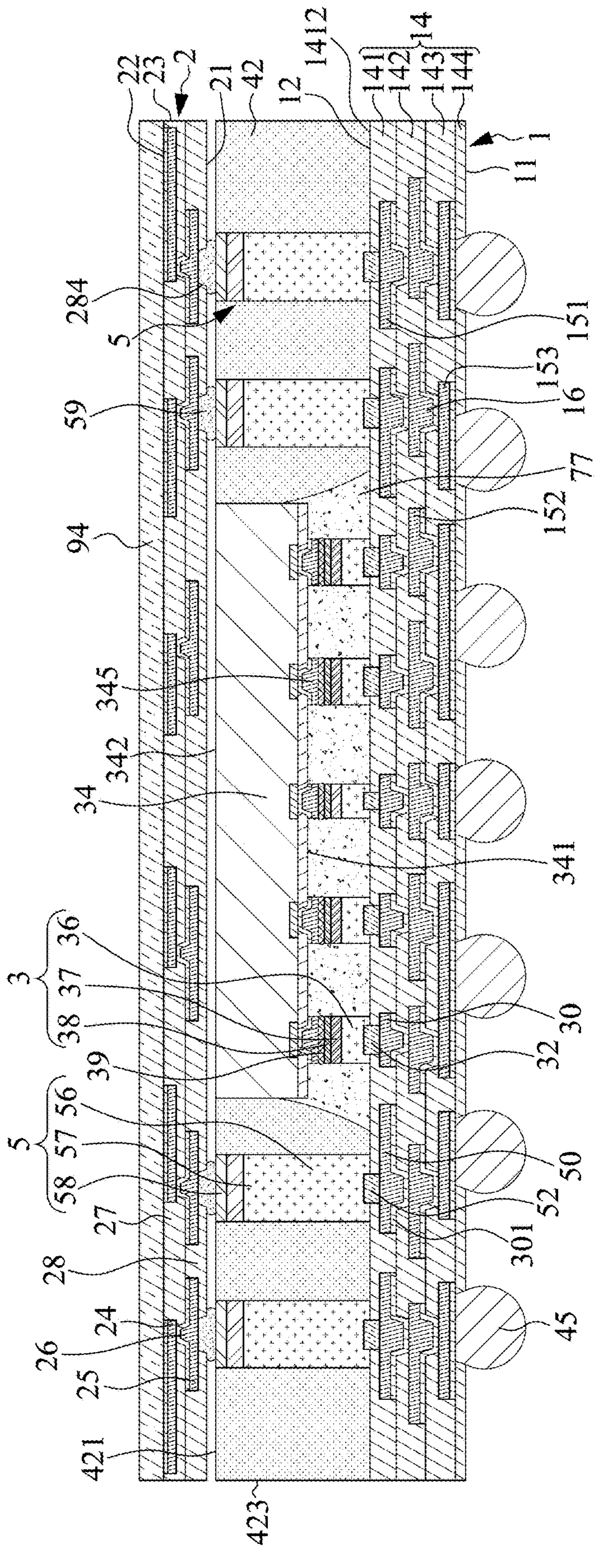

FIG. 6A through FIG. 6P illustrate a method for manufacturing an electronic package 4 according to some embodiments of the present disclosure. In some embodiments, the method is for manufacturing the electronic package 4 shown in FIG. 1.

Referring to FIG. 6A and FIG. 6B, wherein FIG. 6B is an enlarged view of an area C of FIG. 6A, a substrate 1' may be provided. The substrate 1' may include a dielectric structure 14, a plurality of circuit layers 151, 152, 153, and a plurality of inner vias 16. The dielectric structure 14 may include a second dielectric layer 142 and a third dielectric layer 143. The second dielectric layer 142, the third dielectric layer 143, the circuit layers 151, 152, 153, and the inner vias 16 of FIG. 6A may be same as the second dielectric layer 142, the third dielectric layer 143, the circuit layers 151, 152, 153, and the inner vias 16 of FIG. 1.

Referring to FIG. 6C and FIG. 6D, wherein FIG. 6D is an enlarged view of an area D of FIG. 6C, a photoresist layer 60 may be formed or disposed on the second dielectric layer 142 of the substrate 1' to cover the first circuit layer 151. The photoresist layer 60 may be a positive type photoresist layer. Then, at least one opening 601 may be formed in the photoresist layer 60 to expose the pad 30 of the first circuit layer 151, and at least one opening 602 may be formed in the photoresist layer 60 to expose the pad 50 of the first circuit layer 151. Then, at least one conductive element 32 and at least one conductive element 52 may be formed or disposed in the opening 601 and the opening 602, respectively, to contact or connect the pad 30 and the pad 50, respectively. The conductive element 32, 52 of FIG. 6C and FIG. 6D may be same as the conductive element 32, 52 of FIG. 1.

Referring to FIG. 6E and FIG. 6F, wherein FIG. 6F is an enlarged view of an area E of FIG. 6E, the photoresist layer 60 is removed. Then, a first dielectric layer 141 may be formed or disposed on the second dielectric layer 142 of the substrate 1' to cover the first circuit layer 151 and the conductive element 32, 52. It is noted that the first dielectric layer 141 may be a negative type photoresist layer. That is, the type of the first dielectric layer 141 may be different from the type of the photoresist layer 60.

Referring to FIG. 6G and FIG. 6H, wherein FIG. 6H is an enlarged view of an area F of FIG. 6G, the first dielectric layer 141 may be thinned to expose the upper portion 32*u* of the conductive element 32 and the upper portion of the conductive element 32, 52. In some embodiments, the first dielectric layer 141 may be thinned by plasma etching. That is, the upper portion of the first dielectric layer 141 may be removed by a plasma 99. Meanwhile, the Referring to FIG. 6I and FIG. 6J, wherein FIG. 6J is an enlarged view of an area G of FIG. 6I, at least one bump 3 may be formed or disposed on the conductive element 32 and the first dielectric layer 141. At least one vertical conductive structure 5 may be formed or disposed on the conductive element 52 and the first dielectric layer 141. The bump 3 and the vertical conductive structure 5 of FIGS. 6I and 6J may be same as the bump 3 and the vertical conductive structure 5 of FIG. 1, respectively.

Referring to FIG. 6K, an electronic device 34 may be electrically connected to the second surface 12 of the substrate 1' by flip-chip bonding. In some embodiments, the conductive pads 345 of the electronic device 34 may be bonded to the bumps 3 of the substrate 1' through a bonding material 39 such as soldering material. Then, an underfill 77 may be applied in the space between the lower surface 341 of the electronic device 34 and the second surface 12 of the substrate 1' so as to cover and protect the bumps 3 of the substrate 1', the bonding material 39 and the conductive pads 345 of the electronic device 34.

Referring to FIG. 6L, an encapsulant 42 may be formed or disposed on the second surface 12 of the substrate 1' to encapsulate and cover the electronic device 34, the underfill 37 and the vertical conductive structure 5.

Referring to FIG. 6M, the encapsulant 42 may be thinned by, for example, grinding. Thus, the first surface 421 of the encapsulant 42 may be substantially aligned with or coplanar with the top surfaces of the vertical conductive structure 5 and the upper surface 342 (e.g., back side surface) of the electronic device 34.

Referring to FIG. 6N, a fourth dielectric layer 144 may be formed on the third dielectric layer 143. Then, the fourth dielectric layer 144 may be patterned to form a plurality of openings to expose portions of the third circuit layer 153. Then, a plurality of external connectors 45 may be formed or disposed in the openings of the fourth dielectric layer 144, and may be electrically connected to the exposed portions of the third circuit layer 153. Meanwhile, a first circuit pattern structure 1 may be formed from the substrate 1'.

Referring to FIG. 6O, a second circuit pattern structure 2 may be formed or disposed on a carrier 94. The second circuit pattern structure 2 of FIG. 6O may be same as the second circuit pattern structure 2 of FIG. 1.

Referring to FIG. 6P, the structure of FIG. 6N may be attached to the second circuit pattern structure 2 through the bonding material 59 by flip-chip bonding. Meanwhile, the bonding material 59 may contact the top surface of the vertical conductive structure 5. Then, the carrier 94 may be removed. Then, a singulation process may be conducted to obtain a plurality of electronic packages 4 of FIG. 1.

FIG. 7A through FIG. 7E illustrate a method for manufacturing a dielectric layer 70 according to some comparative embodiments of the present disclosure.

Figure 7A:
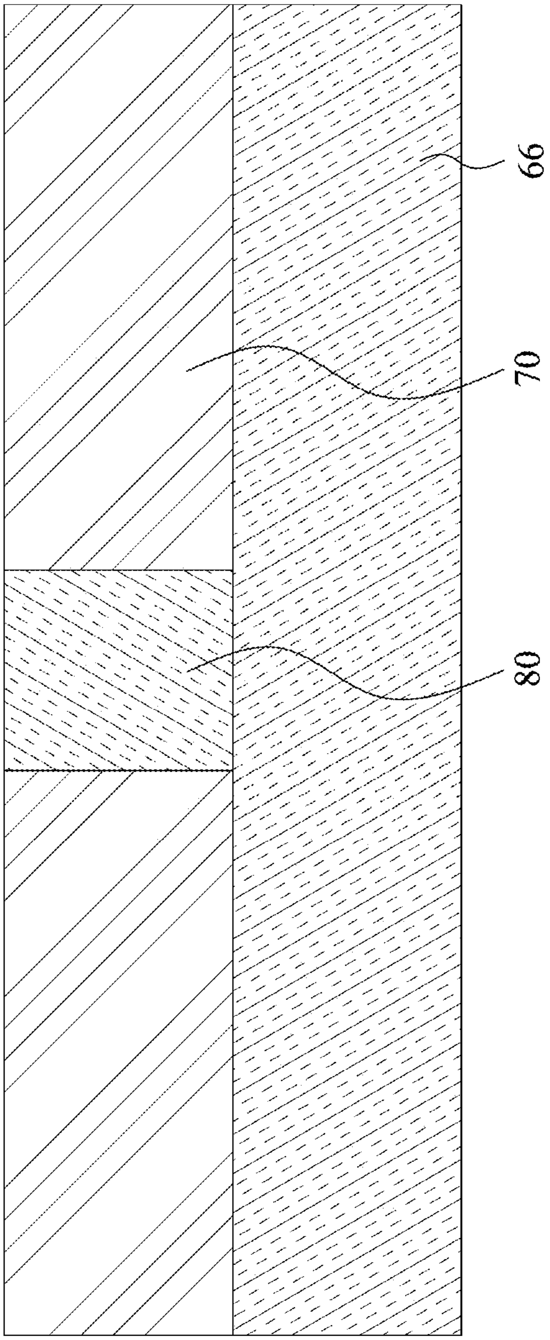
FIG. 7A, FIG. 7B, FIG. 7C, FIG. 7D, and FIG. 7E illustrate a method for manufacturing an electronic package according to some embodiments of the present disclosure.

Referring to FIG. 7A, a photoresist 70 and a carrier 66 are provided. The photoresist 70 includes a negative photoresist. The photoresist 70 is exposed, except for a segment 80 of the photoresist 70. The segment 80 of the negative photoresist 70 is not exposed.

Figure 7B:
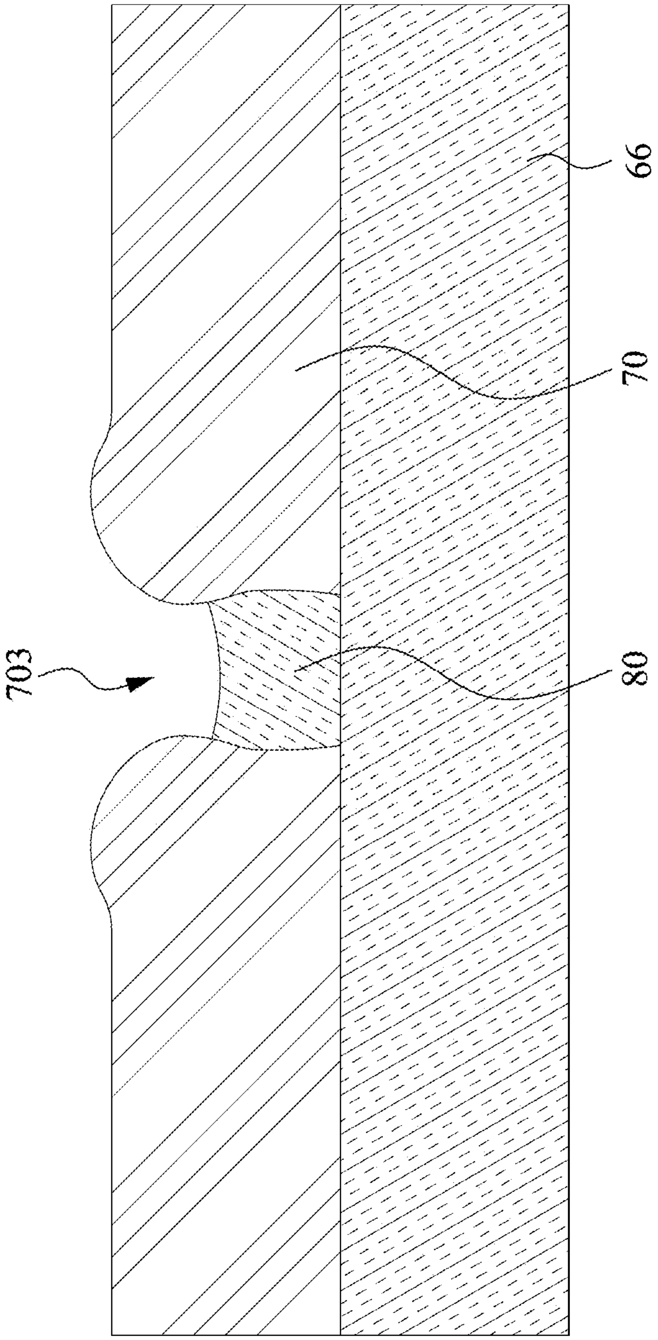

Referring to FIG. 7B, a portion of the segment 80 is removed by using a solvent of cyclopentanone for lithography. A portion adjacent to an opening 703 of the photoresist 70 generates an expansion or a swell.

Figure 7C:
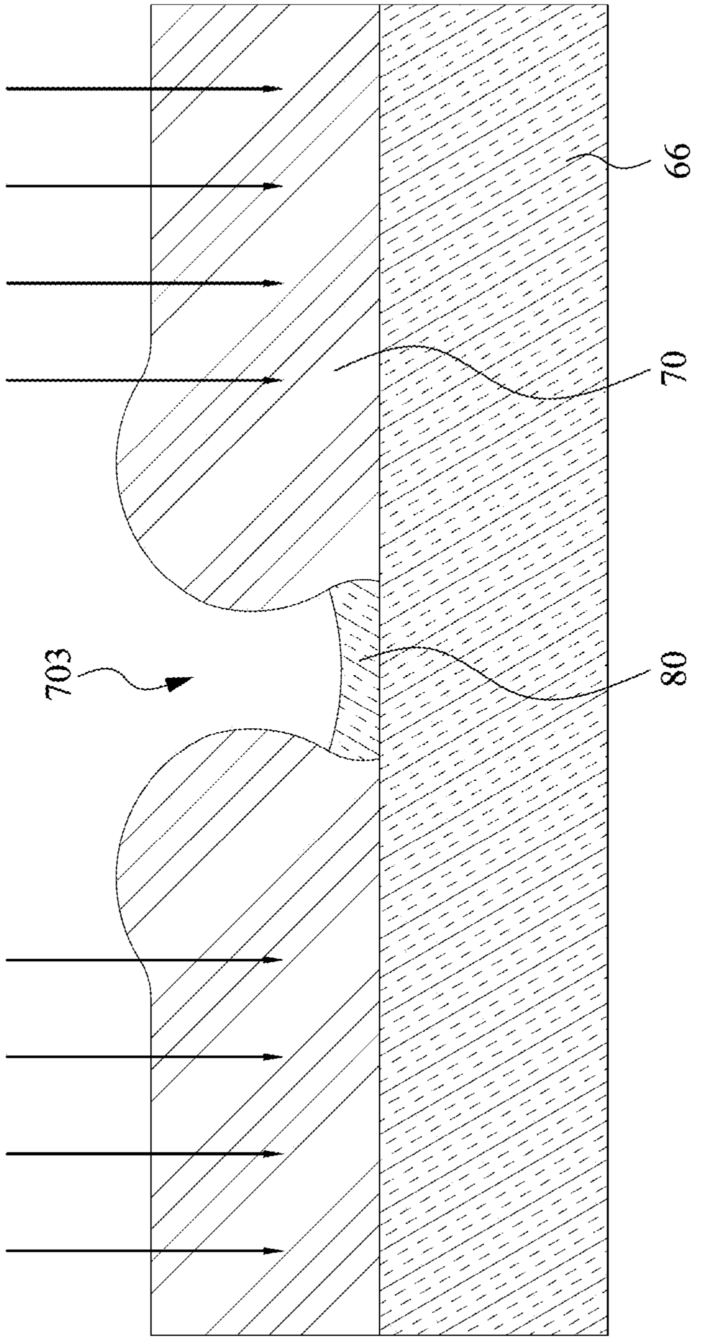

Referring to FIG. 7C, the segment 80 is gradually removed with the passage of time. The expansion or swell adjacent to the opening 703 of the photoresist 70 gradually increases due to the photoresist 70 absorbing of the cyclopentanone.

Figure 7D:
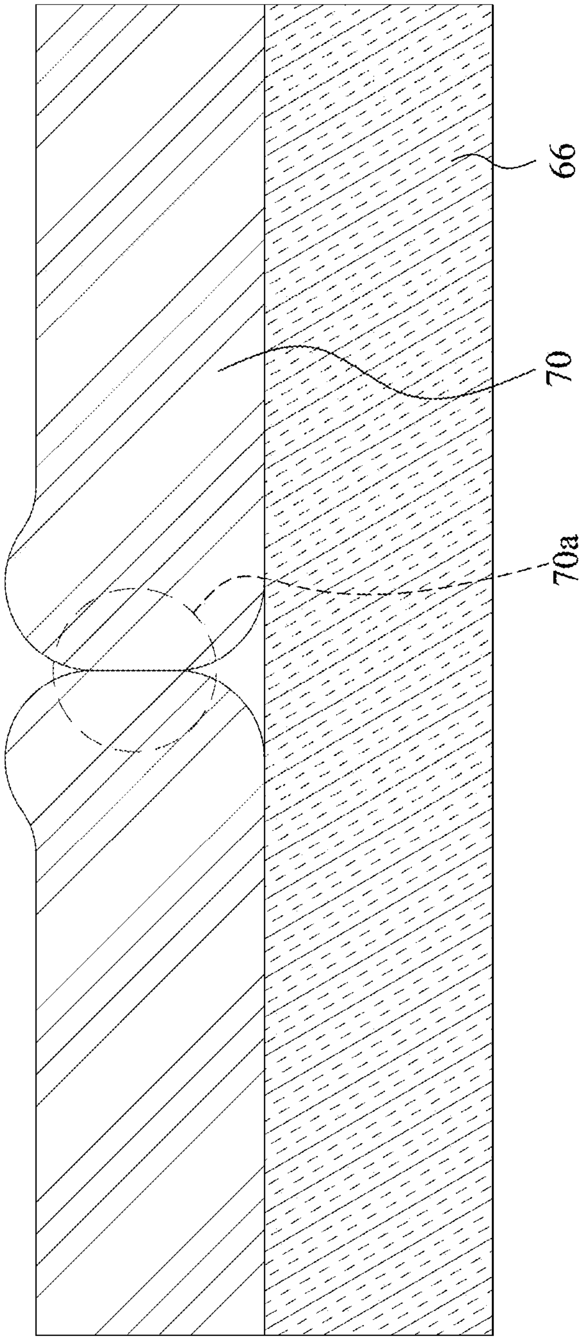

Referring to FIG. 7D, a portion of the opening 703 of the photoresist 70 may be filled due to the contact 70*a* of the two expanded portions or swell portions of the photoresist 70.

Figure 7E:
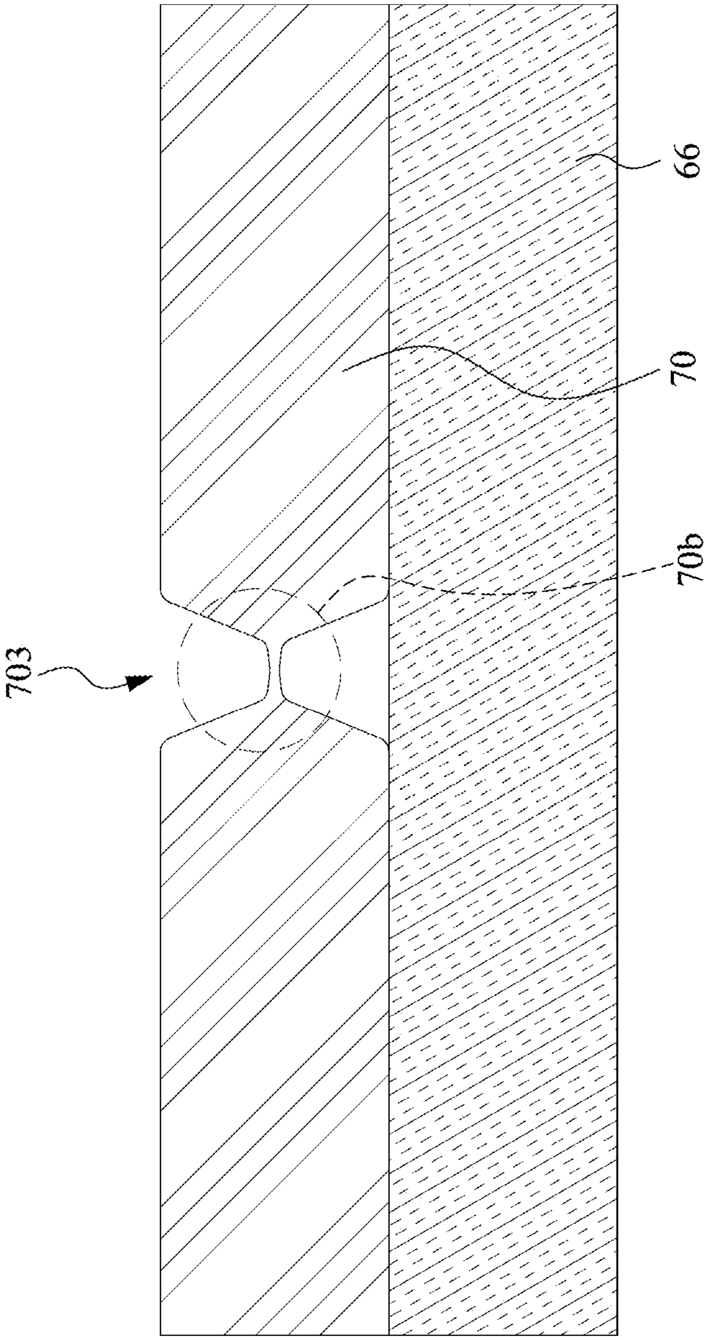

Referring to FIG. 7E, after heating and curing of the photoresist 70, the solvent may be evaporated and removed. A connection portion 70*b* of the photoresist 70 still exists in the opening 703. Thus, the profile of the opening 703 is abnormal. The reliability of the opening 703 of the photoresist 70 may be decreased.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:

a pad;

a dielectric layer encapsulating the pad, and including an opening exposing the pad;

a bump disposed over the pad, wherein the bump includes a first layer and a second layer disposed on the first layer, wherein a lateral width of the second layer is greater than a lateral width of the first layer, wherein an indentation is formed near a bottom corner of the second layer; and a conductive element disposed in the opening between the pad and the bump, wherein the conductive element comprises an upper portion and a lower portion, and the upper portion of the conductive element is surrounded by the first layer of the bump.

2. The electronic package of claim 1, wherein the first layer of the bump includes a first portion disposed on a top surface of the conductive element and a second portion disposed on a lateral surface of the conductive element, wherein a vertical thickness of the first portion is greater than a lateral width of the second portion.

3. The electronic package of claim 1, wherein the indentation is defined by a bottom surface of the second layer and a lateral surface of the first layer.

4. The electronic package of claim 3, wherein the bump further includes a third layer disposed on the second layer, wherein a lateral surface of the third layer is substantially aligned with a lateral surface of the second layer.

5. The electronic package of claim 4, wherein the first layer includes a neck portion.

6. The electronic package of claim 5, wherein a top surface of the pad includes a convex surface, a top surface of the conductive element includes a convex surface, a top surface of the first layer includes a convex surface, and a top surface of the second layer includes a convex surface.

7. The electronic package of claim 1, wherein a top surface of the dielectric layer is an etched surface, a surface roughness of the top surface of the dielectric layer is greater than a surface roughness of a bottom surface of the dielectric layer, wherein the electronic package further comprises a conductive via disposed under the pad, wherein a first surface roughness of a lateral surface of the conductive element is less than a second surface roughness of a lateral surface of the conductive via.

8. An electronic package, comprising:

a pad;

a dielectric layer encapsulating the pad, and including an opening exposing the pad;

a bump disposed over the pad;

a conductive element disposed in the opening between the pad and the bump, wherein the conductive element comprises an upper portion and a lower portion, and the upper portion of the conductive element is surrounded by the bump; and a seed layer disposed between the conductive element and the bump, wherein the seed layer covers a top surface and a lateral surface of the upper portion of the conductive element, wherein the seed layer includes a first portion disposed between the dielectric layer and the bump, wherein the lower portion of the conductive element directly contacts the dielectric layer.

9. The electronic package of claim 8, wherein a lateral surface of the first portion of the seed layer is disposed between a lateral surface of the bump and a lateral surface of the conductive element.

10. The electronic package of claim 8, wherein the lower portion of the conductive element tapers toward the upper portion of the conductive element, and the upper portion of the conductive element has a substantially consistent lateral width.

11. The electronic package of claim 8, wherein the upper portion of the conductive element and the dielectric layer collectively define a gap, wherein a lateral width of the gap decreases towards the pad in a vertical direction, wherein a portion of the bump and the seed layer extend into the gap.

12. The electronic package of claim 11, wherein the dielectric layer includes a convex portion surrounding the conductive element, wherein the convex portion of the dielectric layer includes an upper portion and lower portion, wherein the gap is defined by an outer surface of the upper portion of the convex portion of the dielectric layer and the lateral surface of the upper portion of the conductive element.

13. The electronic package of claim 12, wherein an outer surface of the lower portion of the convex portion of the dielectric layer directly contacts a lateral surface of the lower portion of the conductive element.

14. The electronic package of claim 13, wherein a curvature of the outer surface of the upper portion of the convex portion of the dielectric layer is continuous with a curvature of the outer surface of the lower portion of the convex portion of the dielectric layer.

15. The electronic package of claim 11, wherein the bump includes a first layer and a second layer disposed on the first layer, a lateral width of the second layer is greater than a lateral width of the first layer, wherein an indentation is defined by a bottom surface of the second layer and a lateral surface of the first layer, wherein the gap is disposed within a vertical projection of an area enclosed by the indentation.

16. An electronic package, comprising:

a pad;

a dielectric layer encapsulating the pad, and including an opening exposing the pad;

a bump disposed over the pad; and a conductive element disposed in the opening, wherein the conductive element is configured to inhibit a tilt of the bump and enhance a reliability of a connection between the bump and the conductive element, wherein the conductive element is recessed from a top surface of the dielectric layer.

17. The electronic package of claim 16, wherein the bump includes a first layer and a second layer disposed on the first layer, wherein a top surface of the bump includes a concave surface.

18. The electronic package of claim 17, further comprising:

a first seed layer disposed between the conductive element and the bump; and a second seed layer disposed between the conductive element and the pad.

* * * * *